(12) United States Patent
Kim et al.

(10) Patent No.: US 12,118,221 B2
(45) Date of Patent: Oct. 15, 2024

(54) SEMICONDUCTOR MEMORY DEVICES AND MEMORY SYSTEMS INCLUDING THE SAME

(71) Applicant: Samsung Electronics Co., Ltd., Suwon-si (KR)

(72) Inventors: Jongcheol Kim, Suwon-si (KR); Kiheung Kim, Suwon-si (KR); Taeyoung Oh, Suwon-si (KR); Kyungho Lee, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 18/136,915

(22) Filed: Apr. 20, 2023

(65) Prior Publication Data
US 2023/0418487 A1    Dec. 28, 2023

(30) Foreign Application Priority Data

Jun. 22, 2022  (KR) ........................ 10-2022-0076143
Oct. 5, 2022   (KR) ........................ 10-2022-0126850

(51) Int. Cl.
*G06F 12/00*    (2006.01)
*G06F 3/06*     (2006.01)

(52) U.S. Cl.
CPC .......... *G06F 3/0632* (2013.01); *G06F 3/0604* (2013.01); *G06F 3/0679* (2013.01)

(58) Field of Classification Search
CPC .... G06F 3/0647; G06F 3/0617; G06F 3/0656; G06F 3/0659

USPC .......................................................... 711/154
See application file for complete search history.

(56) References Cited

U.S. PATENT DOCUMENTS

| | | | |
|---|---|---|---|
| 8,949,520 B2 | 2/2015 | Ware et al. | |
| 9,653,141 B2 | 5/2017 | Kim et al. | |
| 11,054,995 B2 | 7/2021 | Schaefer et al. | |
| 11,302,374 B2 | 4/2022 | Jenkinson et al. | |
| 11,532,346 B2* | 12/2022 | Brown ................ | G11C 7/1039 |
| 11,664,063 B2* | 5/2023 | Lovett ................ | G11C 11/4078 365/222 |
| 2019/0228813 A1* | 7/2019 | Nale ................. | G11C 11/40611 |
| 2022/0068348 A1* | 3/2022 | Bennett ............. | G11C 11/4096 |
| 2022/0068364 A1 | 3/2022 | Ayyapureddi | |
| 2022/0121398 A1 | 4/2022 | Nale et al. | |
| 2023/0352076 A1* | 11/2023 | He ...................... | G11C 11/4085 |

* cited by examiner

*Primary Examiner* — Mohamed M Gebril
(74) *Attorney, Agent, or Firm* — Myers Bigel, P.A.

(57) ABSTRACT

A semiconductor memory device includes a memory cell array, a row hammer management circuit and a refresh control circuit. The row hammer management circuit automatically stores random count data in count cells of each of a plurality of memory cell rows during a power-up sequence of the semiconductor memory device and determines counted values by counting a number of times of access associated with each of the plurality of memory cell rows in response to an active command from an external memory controller and stores the counted values in the count cells of each of the plurality of memory cell rows as count data. The refresh control circuit receives a hammer address and performs a hammer refresh operation on one or more of the plurality of memory cell rows that are physically adjacent to a memory cell row that corresponds to the hammer address.

20 Claims, 40 Drawing Sheets

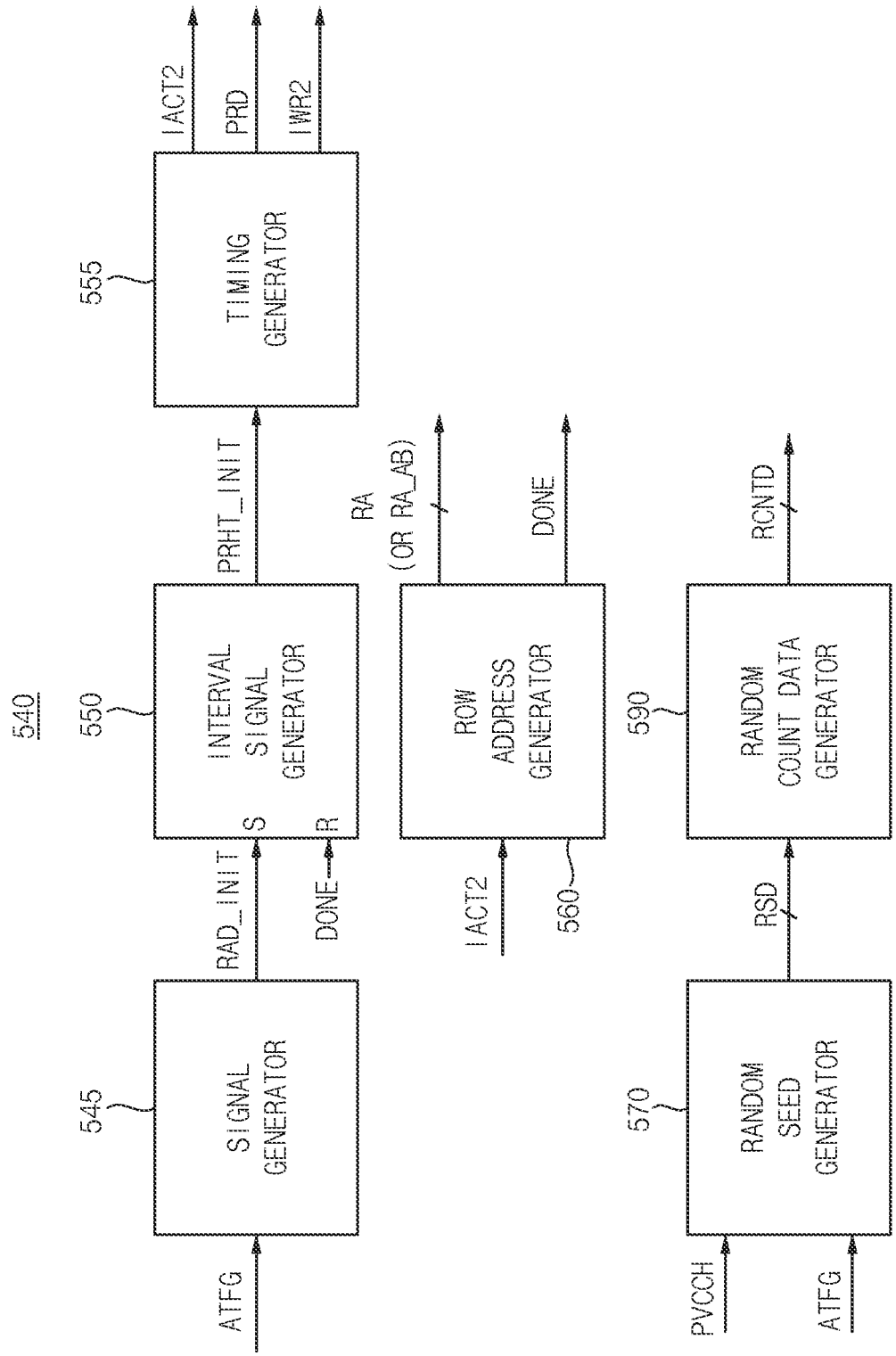

570a

570b

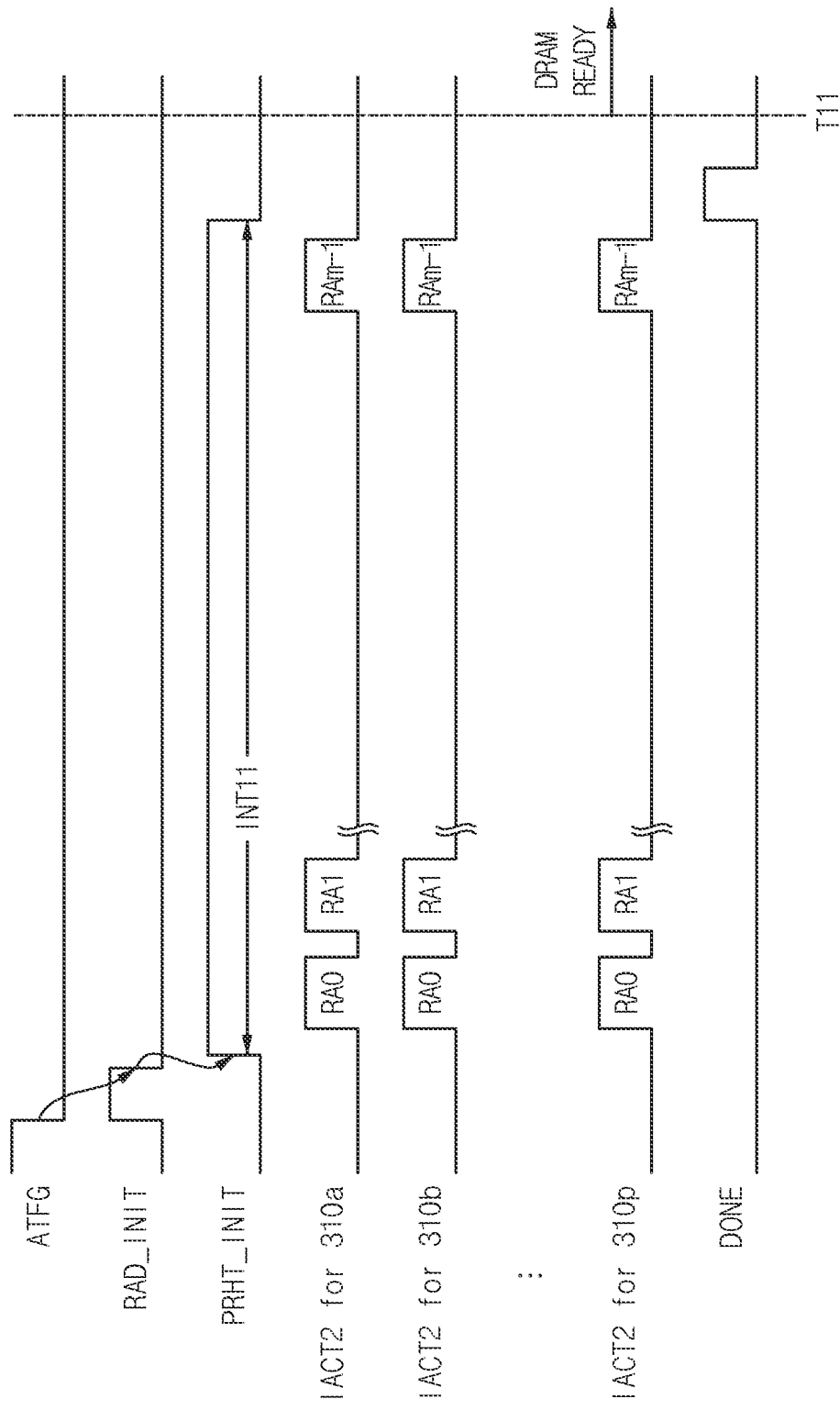

FIG. 22

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| ACT | L | L | L | R0 | R1 | R2 | R3 | BA0 | BA1 | BG0 | BG1 | BG2 | CID0 | CID1 | CID2 |
|  | H | R4 | R5 | R6 | R7 | R8 | R9 | R10 | R11 | R12 | R13 | R14 | R15 | R16 | CID3/R17 |
| WR | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | H | L | V | CID3 |
| RD | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | H | V | V | CID3 |

FIG. 23

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| WRA | L | H | L | H | H | L | BL | BA0 | BA1 | BG0 | BG1 | BG2 | CID0 | CID1 | CID2 |
|  | H | V | C3 | C4 | C5 | C6 | C7 | C8 | C9 | C10 | V | AP | L | V | CID3 |
| RDA | L | H | L | H | H | H | BL | BA0 | BA1 | BG0 | BG1 | BG2 | CID0 | CID1 | CID2 |
|  | H | C2 | C3 | C4 | C5 | C6 | C7 | C8 | C9 | C10 | V | AP | V | V | CID3 |

FIG. 24

| CMD | CS_n | CA0 | CA1 | CA2 | CA3 | CA4 | CA5 | CA6 | CA7 | CA8 | CA9 | CA10 | CA11 | CA12 | CA13 |
|---|---|---|---|---|---|---|---|---|---|---|---|---|---|---|---|
| PREab | L | H | H | L | H | L | CID3 | V | V | V | V | L | CID0 | CID1 | CID2 |
| PREsb | L | H | H | L | H | L | CID3 | BA0 | BA1 | V | V | H | CID0 | CID1 | CID2 |
| PREpb | L | H | H | L | H | L | CID3 | BA0 | BA1 | BG0 | BG1 | BG2 | CID0 | CID1 | CID2 |

SEMICONDUCTOR MEMORY DEVICES AND MEMORY SYSTEMS INCLUDING THE SAME

CROSS-REFERENCE TO RELATED APPLICATIONS

This application claims the benefit of priority under 35 U.S.C. § 119 to Korean Patent Application No. 10-2022-0076143, filed on Jun. 22, 2022 and to Korean Patent Application No. 10-2022-0126850, filed on Oct. 5, 2022, in the Korean Intellectual Property Office, the disclosures of which are incorporated by references herein in their entirety.

BACKGROUND

The present disclosure relates to memories, and more particularly to semiconductor memory devices to defend a row hammer attack and memory systems including the same.

A semiconductor memory device may be classified as a volatile memory device or a nonvolatile memory device. A volatile memory device refers to a memory device that loses data stored therein when power is turned off. As an example of a volatile memory device, a dynamic random access memory (DRAM) may be used in various devices such as a mobile system, a server, or a graphic device.

In volatile memory devices such as dynamic random access memory (DRAM) devices, cell charges stored in a memory cell may be lost by a leakage current. In addition, when a word-line is transitioned frequently between an active state and a precharged state (i.e., when the word-line has been accessed intensively or frequently), an affected memory cell connected to a word-line that is adjacent to the frequently accessed word-line may lose stored charges. Charges stored in a memory cell may be maintained by recharging before data is lost by leakage of cell charges. Such recharge of cell charges is referred to as a refresh operation, and a refresh operation may be performed repeatedly before cell charges are significantly lost.

SUMMARY

Example embodiments may provide semiconductor memory devices capable of defending a row hammer attack while managing row hammer of all of a plurality of memory cell rows.

Example embodiments may provide memory systems including a semiconductor memory device capable of defending a row hammer attack while managing row hammer of all of a plurality of memory cell rows.

According to example embodiments, a semiconductor memory device includes a memory cell array, a row hammer management circuit and a refresh control circuit. The memory cell array includes a plurality of memory cell rows designated by row addresses, each of the plurality of memory cell rows including a plurality of memory cells. The row hammer management circuit includes a hammer address queue and automatically stores random count data in count cells of each of the plurality of memory cell rows during a power-up sequence of the semiconductor memory device and determined counted values by counting a number of times of access associated with each of the plurality of memory cell rows in response to an active command from an external memory controller and stores the counted values in the count cells of each of the plurality of memory cell rows as count data. The hammer address queue stores one or more of the row addresses up to a first number based on a comparison of the counted values with a reference number of times, the one or more of the row addresses being candidate hammer addresses, and outputs one of the candidate hammer addresses stored therein as a hammer address. The refresh control circuit receives the hammer address and performs a hammer refresh operation on one or more of the plurality of memory cell rows that are physically adjacent to a memory cell row that corresponds to the hammer address.

According to example embodiments, a memory system includes a semiconductor memory device and a memory controller that controls the semiconductor memory device. The semiconductor memory device includes a memory cell array, a row hammer management circuit and a refresh control circuit. The memory cell array includes a plurality of memory cell rows designated by row addresses, each of the plurality of memory cell rows including a plurality of memory cells. The row hammer management circuit includes a hammer address queue and automatically stores random count data in count cells of each of the plurality of memory cell rows independently from a command from the memory controller during a power-up sequence of the semiconductor memory device and determines counted values by counting a number of times of access associated with each of the plurality of memory cell rows in response to an active command from the memory controller and stores the counted values in the count cells of each of the plurality of memory cell rows as count data. The hammer address queue stores one or more of the row addresses up to a first number based on a comparison of the counted values with a reference number of times, the one or more of the row addresses being candidate hammer addresses, and outputs one of the candidate hammer addresses stored therein as a hammer address. The refresh control circuit receives the hammer address and performs a hammer refresh operation on one or more of the plurality of memory cell rows that are physically adjacent to a memory cell row that corresponds to the hammer address. The row hammer management circuit further includes an automatic initialization controller that generates, during the power-up sequence, the random count data and the row addresses that designate each of the plurality of memory cell rows, based on a power stabilizing signal and an anti-fuse flag signal.

According to example embodiments, a semiconductor memory device includes a memory cell array, a row hammer management circuit, a refresh control circuit and a control logic circuit. The memory cell array includes a plurality of memory cell rows designated by row addresses, each of the plurality of memory cell rows including a plurality of memory cells. The row hammer management circuit includes a hammer address queue and automatically stores random count data in count cells of each of the plurality of memory cell rows during a power-up sequence of the semiconductor memory device and determines counted values by counting a number of times of access associated with each of the plurality of memory cell rows in response to an active command from an external memory controller and stores the counted values in the count cells of each of the plurality of memory cell rows as count data. The hammer address queue stores one or more of the row addresses up to a first number based on a comparison of the counted values with a reference number of times, the one or more of the row addresses being candidate hammer addresses, and outputs one of the candidate hammer addresses stored therein as a hammer address. The refresh control circuit receives the hammer address and performs a hammer refresh operation on one or more of the plurality of memory cell rows that are physically adjacent to a memory cell row that corresponds to the hammer address. The control logic circuit controls the row hammer management circuit and the refresh control circuit, and performs a self-refresh operation on the plurality of memory cell rows after the random count data is stored in the count cells of each of the plurality of memory cell rows.

Accordingly, in semiconductor memory devices according to example embodiments, the row hammer management circuit may automatically generate the random count data and stores the random count data in count cells of each of the plurality of memory cell rows without receiving a command from the memory controller during a power-up sequence, and thus the row hammer management circuit may prevent overflow occurring in the hammer address queue although repeated accesses by a hacker on memory cell rows are generated.

BRIEF DESCRIPTION OF THE DRAWINGS

Example embodiments of the present disclosure will be described below in more detail with reference to the accompanying drawings.

FIG. 9 illustrates an example of the automatic initialization controller in the row hammer management circuit of FIG. 8 according to example embodiments.

FIG. 12B is a timing diagram illustrating an operation of the automatic initialization controller of FIG. 9 according to example embodiments.

FIGS. 22 through 24 illustrate example commands which may be used in the memory system of FIG. 1.

DETAILED DESCRIPTION

Various example embodiments of the present disclosure will be described more fully hereinafter with reference to the accompanying drawings, in which example embodiments are shown.

Figure 1:
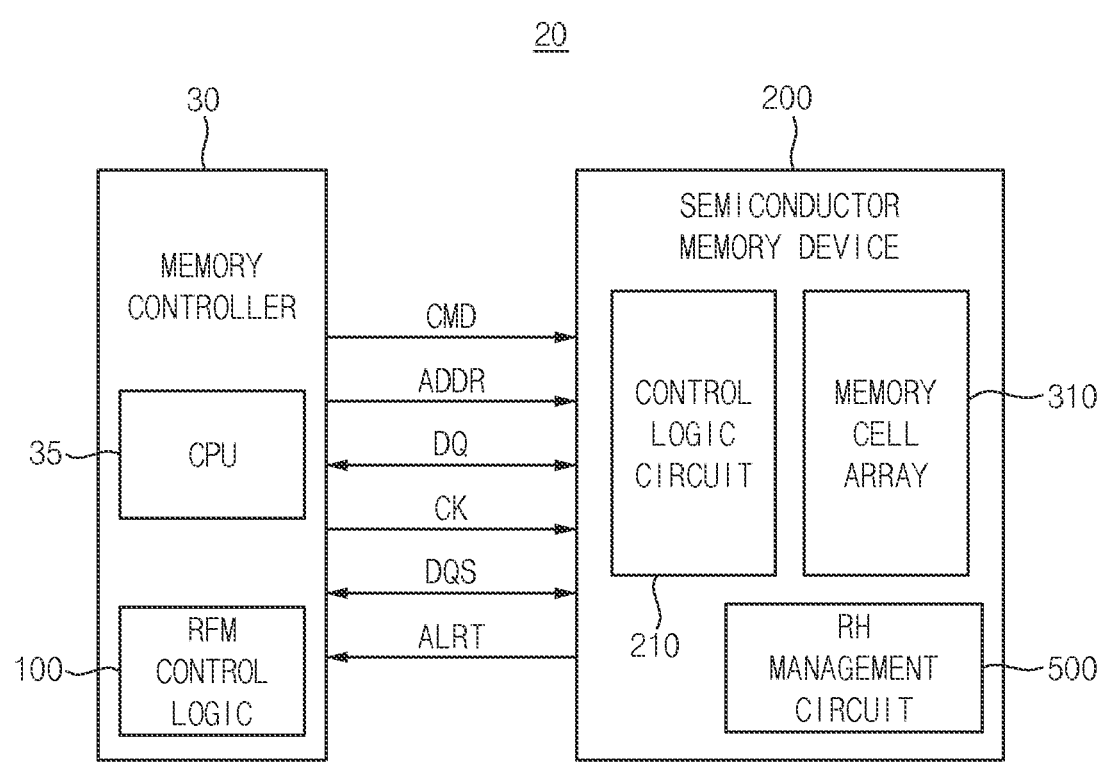
FIG. 1 is a block diagram illustrating a memory system according to example embodiments.

FIG. 1 is a block diagram illustrating a memory system according to example embodiments.

Referring to FIG. 1, a memory system 20 may include a memory controller 30 and a semiconductor memory device 200.

The memory controller 30 may control overall operation of the memory system 20. The memory controller 30 may control overall data exchange between an external host and the semiconductor memory device 200. For example, the memory controller 30 may write data in the semiconductor memory device 200 or read data from the semiconductor memory device 200 in response to request from the host.

In addition, the memory controller 30 may issue operation commands to the semiconductor memory device 200 for controlling the semiconductor memory device 200. In some example embodiments, the semiconductor memory device 200 is a memory device including dynamic memory cells such as a dynamic random access memory (DRAM), double data rate 5 (DDR5) synchronous DRAM (SDRAM), a DDR6 SDRAM or the like.

The memory controller 30 may transmit a clock signal CK (the clock signal CK may be referred to as a command clock signal), a command CMD, and an address (signal) ADDR to the semiconductor memory device 200. Herein, for convenience of description, the terms of a clock signal CK, a command CMD, and an address ADDR and the terms of clock signals CK, commands CMD, and addresses ADDR may be used interchangeably. The memory controller 30 may transmit a data strobe signal DQS to the semiconductor memory device 200 when the memory controller 30 writes data signal DQ in the semiconductor memory device 200. The semiconductor memory device 200 may transmit a data strobe signal DQS to the memory controller 30 when the memory controller 30 reads data signal DQ from the semiconductor memory device 200. The address ADDR may be accompanied by the command CMD and the address ADDR may be referred to as an access address.

The memory controller 30 may include a central processing unit (CPU) 35 that controls overall operation of the memory controller 30 and a refresh management (RFM) control logic 100 that generates a refresh management command associated with a row hammer of the plurality of memory cell rows of the semiconductor memory device 200.

The semiconductor memory device 200 may include a memory cell array 310 that stores the data signal DQ, a control logic circuit 210 and a row hammer (RH) management circuit 500.

The control logic circuit 210 may control operations of the semiconductor memory device 200. The memory cell array 310 may include a plurality of memory cell rows and each of the memory cell rows may include a plurality of (volatile) memory cells. For example, the plurality of memory cell rows may be designated by row addresses.

The row hammer management circuit 500 may automatically store random count data in count cells of each of the plurality of memory cell rows independently from a command from the memory controller 30 during a power-up sequence of the semiconductor memory device 200.

After the power-up sequence and a training between the memory controller 30 and the semiconductor memory device 200 are completed, the row hammer management circuit 500, in response to an active command from the memory controller 30, may count the number of times of access associated with each of the plurality of memory cell rows to store the counted values in the count cells of each of the plurality of memory cell rows as count data. For example, the row hammer management circuit 500 may determine counted values by counting a number of times of access associated with each of the plurality of memory cell rows and may store the counted values in the count cells of each of the plurality of memory cell rows as count data in response to an active command from the memory controller 30. The row hammer management circuit 500 may store one or more candidate hammer addresses up to a first number based on first-in first-out (FIFO), which are intensively accessed, from among the plurality of memory cell rows, based on a comparison of the counted value with a reference number of times, may transit a logic level of an alert signal ALRT provided to the memory controller 30 in response to a number of the candidate hammer addresses stored therein reaching the first number, and may output one of the candidate hammer addresses stored therein as a hammer address, in response to the number of the candidate hammer addresses stored therein reaching the first number. For example, the row hammer management circuit 500 may store one or more row addresses up to a first number based on a comparison of the counted values with a reference number of times, and the one or more row addresses may be candidate hammer addresses. The row addresses, for example, may designate or correspond to each of the plurality of memory cell rows. Herein, the term "intensively accessed" may mean that a particular memory cell row is accessed equal to or more than the first reference number of times. For example, ones of the row addresses that are accessed equal to or more than the first reference number of times may be candidate hammer addresses.

In response to a subsequent command such as an active count update command or a precharge command applied after the active command, the row hammer management circuit 500 may perform an internal read-update-write operation, to read the count data from a target memory cell row from among the plurality of memory cell rows, to update the read count data, and to write the updated count data in the target memory cell row. For example, in response to a subsequent command such as an active count update command or a precharge command applied after the active command, the row hammer management circuit 500 may perform an internal read-update-write operation that includes reading the count data from a target memory cell row from among the plurality of memory cell rows, updating the read count data, and writing the updated count data in the target memory cell row.

The row hammer management circuit 500 may update the counted values stored in the count cells of the target memory cell row in response to the subsequent command. The active count update command may be a dedicated command for designating the internal read-update-write operation, which is applied to the semiconductor memory device 200 after a read command or a write command on the target memory cell row and before precharging the target memory cell row.

In example embodiments, the row hammer management circuit 500 may perform the internal read-update-write operation based on a flag of a precharge command which is applied after the active command is applied and the control logic circuit 210 may precharge the target memory cell row.

In example embodiments, the row hammer management circuit 500 may perform the internal read-update-write operation before precharging the target memory cell row based on either a flag of a read command including an auto precharge or a flag of a write command including an auto precharge which is selectively applied after the active command is applied.

The semiconductor memory device 200 may perform a refresh operation periodically due to charge leakage of memory cells storing data. Due to scale down of the manufacturing process of the semiconductor memory device 200, the storage capacitance of the memory cell may be decreased and the refresh period may be shortened. The refresh period may be further shortened because the entire refresh time is increased as the memory capacity of the semiconductor memory device 200 is increased.

To compensate for degradation of adjacent memory cells due to the intensive access to a particular row or a hammer address, a target row refresh (TRR) scheme was adopted and an in-memory refresh scheme is developed to reduce the burden of the memory controller. The memory controller is totally responsible for the hammer refresh operation in the TRR scheme and the semiconductor memory device is totally responsible for the hammer refresh operation in the in-memory refresh scheme.

The chip size overhead for the in-memory refresh may be serious as the memory capacity is increased and demands on low power consumption of the semiconductor memory device is increased. In addition, the power consumption may be increased because the semiconductor memory device has to care the hammer refresh operation even though there is no intensive access. In addition, a row hammer of some of memory cell row selected from the plurality of the memory cell rows is managed.

In the memory system 20 according to example embodiments, while the row hammer management circuit 500 counts each of active numbers associated with the plurality of memory cell rows to store the counted values in the count cells of each of the plurality of memory cell rows as count data and may manage the row hammer of all of the memory cell rows based on the counted values, the semiconductor memory device 200 stores the random count data in the count cells of each of the plurality of memory cell rows during a power-up sequence during which the memory controller 30 cannot issue commands to the semiconductor memory device 200 and thus prevent performance of the memory system 20 from being degraded due to intentional accesses of a hacker.

Figure 2:
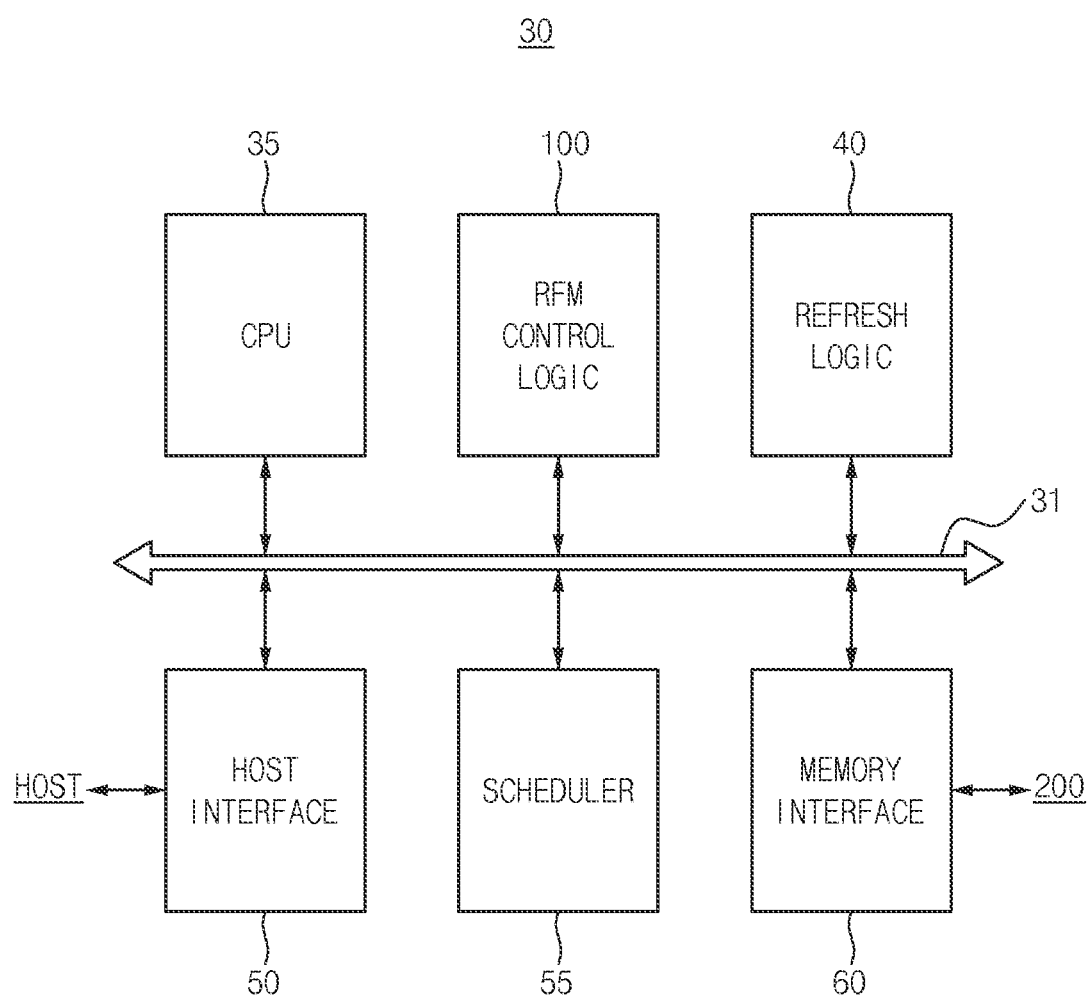
FIG. 2 is a block diagram illustrating the memory controller in FIG. 1 according to example embodiments.

FIG. 2 is a block diagram illustrating the memory controller in FIG. 1 according to example embodiments.

Referring to FIG. 2, the memory controller 30 may include the CPU 35, the RFM control logic 100, a refresh logic 40, a host interface 50, a scheduler 55 and a memory interface 60 which are connected to each other through a bus 31.

The CPU 35 may control overall operation of the memory controller 30. The CPU 35 may control the RFM control logic 100, the refresh logic 40, the host interface 50, the scheduler 55 and the memory interface 60 through the bus 31.

The refresh logic 40 may generate auto refresh command for refreshing memory cells of the plurality of memory cell rows based on a refresh interval of the semiconductor memory device 200.

The host interface 50 may perform interfacing with a host. The memory interface 60 may perform interfacing with the semiconductor memory device 200.

The scheduler 55 may manage scheduling and transmission of sequences of commands generated in the memory controller 30. The scheduler 55 may transmit the active command and subsequent commands to the semiconductor memory device 200 via the memory interface 60 and the semiconductor memory device 200 may update active count of each of the memory cell rows to may manage the row hammer of all of the memory cell rows.

The RFM control logic 100 may apply a refresh management command to the semiconductor memory device 200 through the memory interface 60 in response to a transition of the alert signal ALRT (see FIG. 1) from the semiconductor memory device 200 such that the semiconductor memory device 200 performs a hammer refresh operation on one or more victim memory cell rows which are physically adjacent to a memory cell row corresponding to the hammer address. Herein, "a transition of a signal" (or similar language) may mean a signal edge of the signal is transitioning from logic high to logic low (e.g., a falling edge) or from logic low to logic high (e.g., a rising edge). The hammer refresh operation refers to a refresh operation and may include recharging memory cells of one or more memory cell rows that are physically adjacent to a memory cell row corresponding to the hammer address FIG. 3 is a block diagram illustrating an example of the semiconductor memory device in FIG. 1 according to example embodiments.

Figure 3:
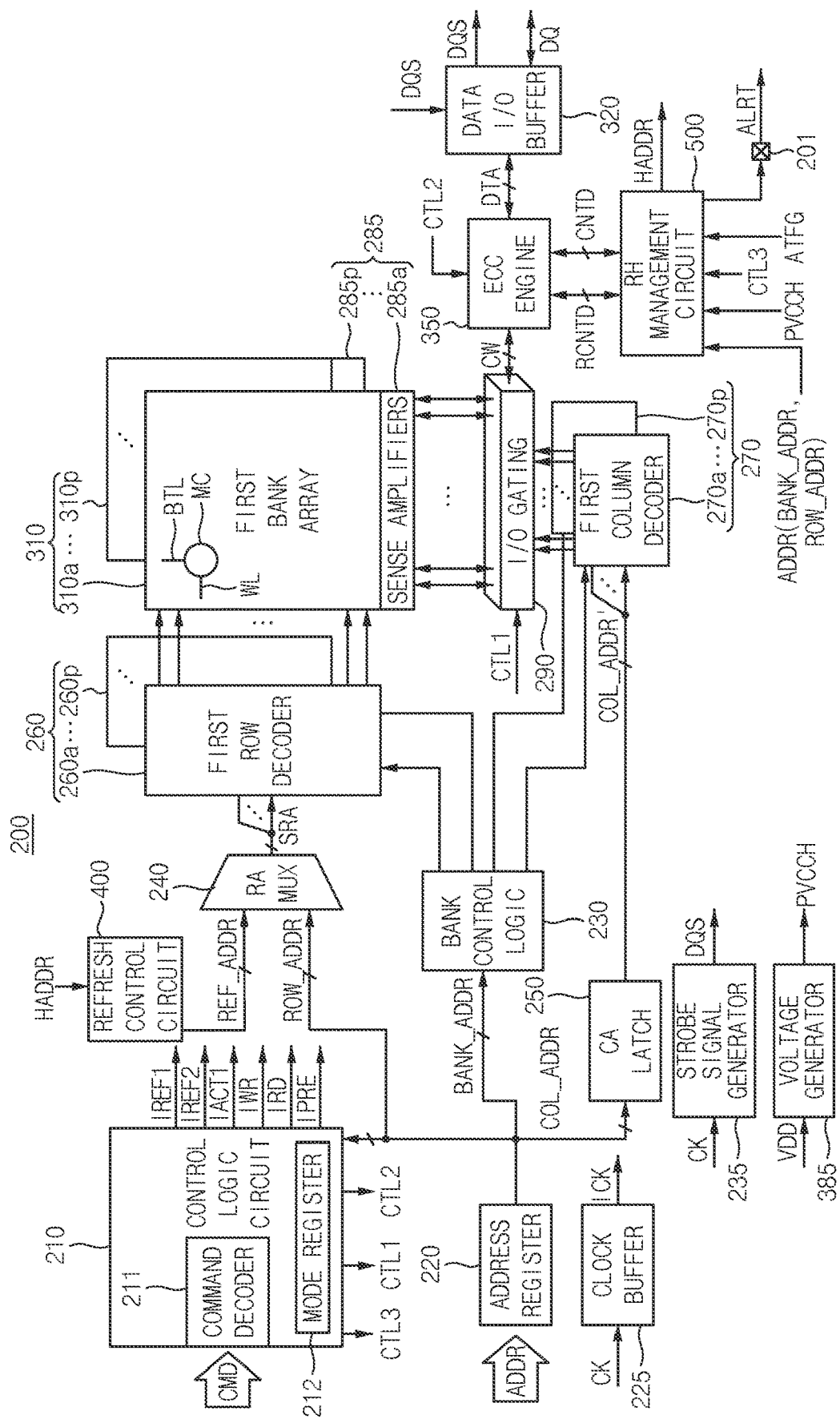
FIG. 3 is a block diagram illustrating an example of the semiconductor memory device in FIG. 1 according to example embodiments.

Referring to FIG. 3, the semiconductor memory device 200 may include the control logic circuit 210, an address register 220, a bank control logic 230, a refresh control circuit 400, a row address multiplexer 240, a column address latch 250, a row decoder 260, a column decoder 270, the memory cell array 310, a sense amplifier unit 285, an I/O gating circuit 290, an error correction code (ECC) engine 350, a clock buffer 225, a strobe signal generator 235, a voltage generator 385, the row hammer management circuit 500 and a data I/O buffer 320.

The memory cell array 310 may include first through sixteenth bank arrays 310a~310p. The row decoder 260 may include first through sixteenth row decoders 260a~260p respectively coupled to the first through sixteenth bank arrays 310a~310p, the column decoder 270 may include first through sixteenth column decoders 270a~270p respectively coupled to the first through sixteenth bank arrays 310a~310p, and the sense amplifier unit 285 may include first through sixteenth sense amplifiers 285a~285p respectively coupled to the first through sixteenth bank arrays 310a~310p.

The first through sixteenth bank arrays 310a~310p, the first through sixteenth row decoders 260a~260p, the first through sixteenth column decoders 270a~270p and first through sixteenth sense amplifiers 285a~285p may form first through sixteenth banks. Each of the first through sixteenth bank arrays 310a~310p may include a plurality of memory cells MC formed at intersections of a plurality of word-lines WL and a plurality of bit-lines BTL.

The address register 220 may receive the address ADDR including a bank address BANK_ADDR, a row address ROW_ADDR and a column address COL_ADDR from the memory controller 30. The address register 220 may provide the received bank address BANK_ADDR to the bank control logic 230, may provide the received row address ROW_ADDR to the row address multiplexer 240, and may provide the received column address COL_ADDR to the column address latch 250. In addition, the address register 220 may provide the received bank address BANK_ADDR and the received row address ROW_ADDR to the row hammer management circuit 500.

The bank control logic 230 may generate bank control signals in response to the bank address BANK_ADDR. One of the first through sixteenth row decoders 260a~260p corresponding to the bank address BANK_ADDR may be activated in response to the bank control signals, and one of the first through sixteenth column decoders 270a~270p corresponding to the bank address BANK_ADDR may be activated in response to the bank control signals.

The row address multiplexer 240 may receive the row address ROW_ADDR from the address register 220, and may receive a refresh row address REF_ADDR from the refresh control circuit 400. The row address multiplexer 240 may selectively output the row address ROW_ADDR or the refresh row address REF_ADDR as a row address SRA. The row address SRA that is output from the row address multiplexer 240 is applied to the first through sixteenth row decoders 260a~260p.

The refresh control circuit 400 may sequentially increase or decrease the refresh row address REF_ADDR in a normal refresh mode in response to first and second refresh control signals IREF1 and IREF2 from the control logic circuit 210. The refresh control circuit 400 may receive a hammer address HADDR in a hammer refresh mode, and may output one or more hammer refresh addresses designating one or more victim memory cell rows physically adjacent to a memory cell row corresponding to the hammer address as the refresh row address REF_ADDR.

The activated one of the first through sixteenth row decoders 260a~260p, by the bank control logic 230, may decode the row address SRA that is output from the row address multiplexer 240, and may activate a word-line corresponding to the row address SRA. For example, the activated bank row decoder may apply a word-line driving voltage to the word-line corresponding to the row address.

The column address latch 250 may receive the column address COL_ADDR from the address register 220, and may temporarily store the received column address COL_ADDR. In some embodiments, in a burst mode, the column address latch 250 may generate column address COL_ADDR' that increment from the received column address COL_ADDR. The column address latch 250 may apply the temporarily stored or generated column address COL_ADDR' to the first through sixteenth column decoders 270a~270p.

The activated one of the first through sixteenth column decoders 270a~270p may activate a sense amplifier corresponding to the bank address BANK_ADDR and the column address COL_ADDR through the I/O gating circuit 290.

The I/O gating circuit 290 may include a circuitry for gating input/output data, and may further include input data mask logic, read data latches for storing data that is output from the first through sixteenth bank arrays 310a~310p, and write drivers for writing data to the first through sixteenth bank arrays 310a~310p.

Codeword CW (e.g., read codeword RCW in FIG. 19) read from a selected one bank array of the first through sixteenth bank arrays 310a~310p is sensed by a sense amplifier coupled to the selected one bank array from which the data is to be read, and is stored in the read data latches. The codeword CW stored in the read data latches may be provided to the data I/O buffer 320 as data DTA (e.g., corrected data C_DTA in FIG. 19) after ECC decoding is performed on the codeword CW by the ECC engine 350. The data I/O buffer 320 may convert the data DTA into the data signal DQ and may transmit the data signal DQ along with the data strobe signal DQS to the memory controller 30.

The data signal DQ to be written in a selected one bank array of the first through sixteenth bank arrays 310a~310p may be provided to the data I/O buffer 320 from the memory controller 30. The data I/O buffer 320 may convert the data signal DQ to the data DTA and may provide the data DTA to the ECC engine 350. The ECC engine 350 may perform an ECC encoding on the data DTA to generate parity bits, and the ECC engine 350 may provide the codeword CW including data DTA and the parity bits to the I/O gating circuit 290. The I/O gating circuit 290 may write the codeword CW in a sub-page in the selected one bank array through the write drivers.

The data I/O buffer 320 may provide the data signal DQ from the memory controller 30 to the ECC engine 350 by converting the data signal DQ to the data DTA in a write operation of the semiconductor memory device 200 and may convert the data DTA to the data signal DQ from the ECC engine 350 and may transmit the data signal DQ and the data strobe signal DQS to the memory controller 30 in a read operation of the semiconductor memory device 200.

The ECC engine 350 may perform an ECC encoding on the data DTA and may perform an ECC decoding on the codeword CW based on a second control signal CTL2 from the control logic circuit 210. The ECC engine 350 may perform an ECC encoding and an ECC decoding on random count data RCNTD and/or count data CNTD provided from the row hammer management circuit 500 based on the second control signal CTL2 from the control logic circuit 210.

The clock buffer 225 may receive the clock signal CK, may generate an internal clock signal ICK by buffering the clock signal CK, and may provide the internal clock signal ICK to circuit components processing the command CMD and the address ADDR.

The strobe signal generator 235 may receive the clock signal CK, may generate the data strobe signal DQS based on the clock signal CK and may provide the data strobe signal DQS to the data I/O buffer 320.

The voltage generator 385 may generate an operating voltage VDD1 (see FIG. 11) based on a power supply voltage VDD received from an outside device (e.g., an external device) during a power-up sequence of the semiconductor memory device 200, may generate a power stabilizing signal PVCCH indicating that the power supply voltage VDD has reached a reference voltage level, and may provide the power stabilizing signal PVCCH to the row hammer management circuit 500.

The row hammer management circuit 500 may automatically store random count data RCNTD in the count cells of each of the plurality of memory cell rows based on the power stabilizing signal PVCCH and an anti-fuse flag signal ATFG during a power-up sequence of the semiconductor memory device 200. The anti-fuse flag signal ATFG may indicate that information associated with an anti-fuse circuit of the semiconductor memory device 200 has been transferred.

After the power-up sequence and a training between the memory controller 30 and the semiconductor memory device 200 are completed, the row hammer management circuit 500 may count the number of times of access associated with each of the plurality of memory cell rows in response to an active command from the memory controller 30 to store the counted values in the count cells of each of the plurality of memory cell rows as the count data CNTD. The row hammer management circuit 500 may store one or more candidate hammer addresses up to a first number based on first-in first-out (FIFO) scheme, which are intensively accessed, from among the plurality of memory cell rows, based on a comparison of the counted value with a reference number of times, may transit a logic level of the alert signal ALRT provided to the memory controller 30 through an alert pin 201 in response to a number of the candidate hammer addresses stored therein reaching the first number, and may provide one of the candidate hammer addresses stored therein as a hammer address HADDR to the refresh control circuit 400.

The control logic circuit 210 may control operations of the semiconductor memory device 200. For example, the control logic circuit 210 may generate control signals for the semiconductor memory device 200 in order to perform a write operation, a read operation, a normal refresh operation and a hammer refresh operation. The control logic circuit 210 may include a command decoder 211 that decodes the command CMD received from the memory controller 30 and a mode register 212 that sets an operation mode of the semiconductor memory device 200.

For example, the command decoder 211 may generate the control signals corresponding to the command CMD by decoding a write enable signal, a row address strobe signal, a column address strobe signal, a chip select signal, etc. The control logic circuit 210 may provide a first control signal CTL1 to the I/O gating circuit, the second control signal CTL2 to the ECC engine 350 and a third control signal CTL3 to the row hammer management circuit 500. In addition, the command decoder 211 may generate internal command signals including the first refresh control signal IREF1, the second refresh control signal IREF2, an active signal IACT1, a precharge signal IPRE, a read signal IRD and a write signal IWR by decoding the command CMD.

Figure 4:
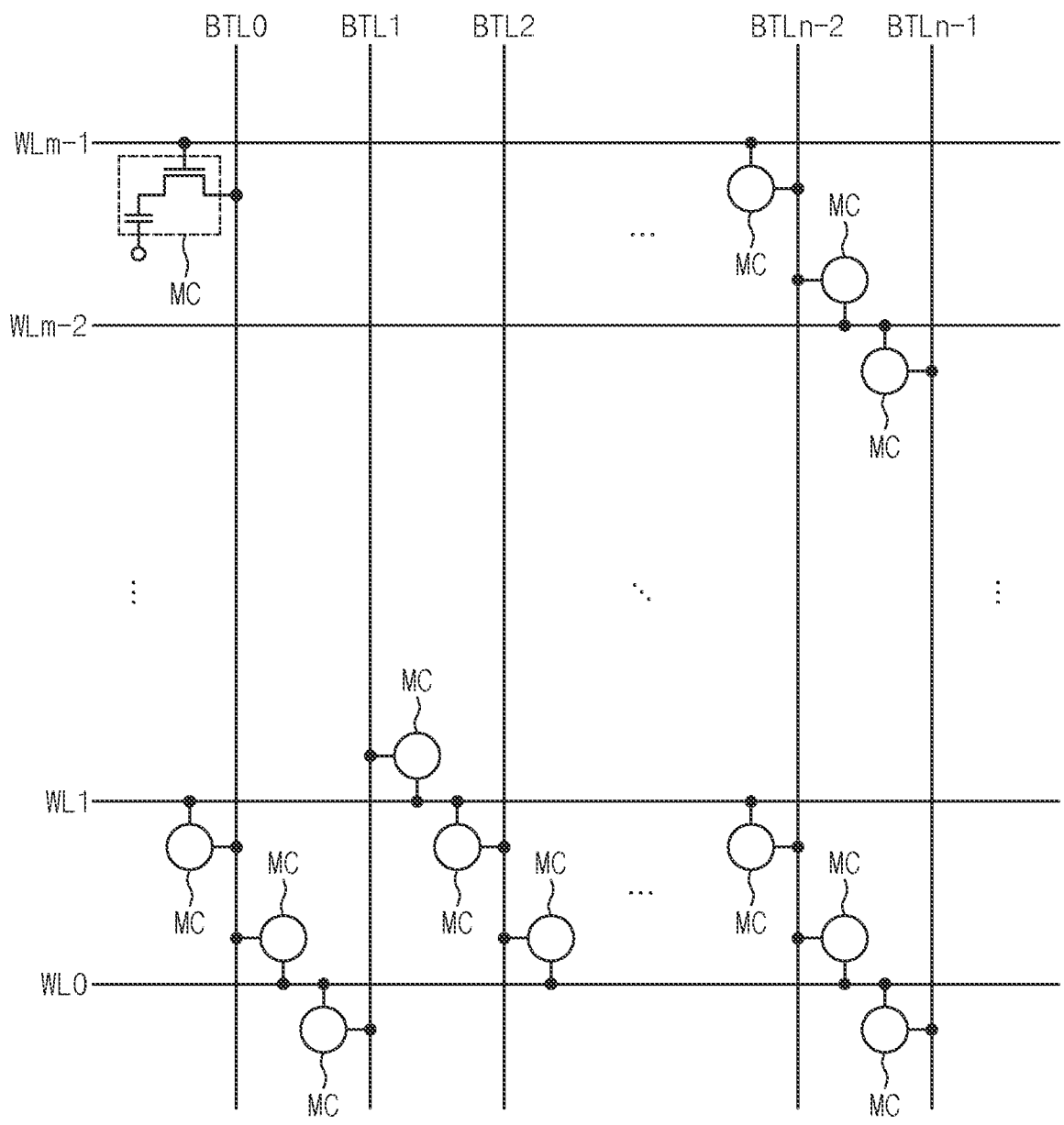
FIG. 4 illustrates an example of the first bank array in the semiconductor memory device of FIG. 3.

FIG. 4 illustrates an example of the first bank array in the semiconductor memory device of FIG. 3.

Referring to FIG. 4, the first bank array 310a includes a plurality of word-lines WL0~WLm−1 (m is a natural number greater than two), a plurality of bit-lines BTL0~BTLn−1 (n is a natural number greater than two), and a plurality of memory cells MCs disposed at intersections between the word-lines WL0~WLm−1 and the bit-lines BTL0~BTLn−1. Each of the memory cells MCs includes a cell transistor coupled to each of the word-lines WL0~WLm−1 and each of the bit-lines BTL0~BTLn−1 and a cell capacitor coupled to the cell transistor. Each of the memory cells MCs may have a DRAM cell structure. Each of the word-lines WL0~WLm−1 extends in a first direction D1 and each of the bit-lines BTL1~BTLn−1 extends in a second direction D2 crossing the first direction D1.

The word-lines WL0~WLm−1 coupled to the plurality of memory cells MCs may be referred to as rows of the first bank array 310a and the bit-lines BTL0~BTLn−1 coupled to the plurality of memory cells MCs may be referred to as columns of the first bank array 310a.

Figure 5:
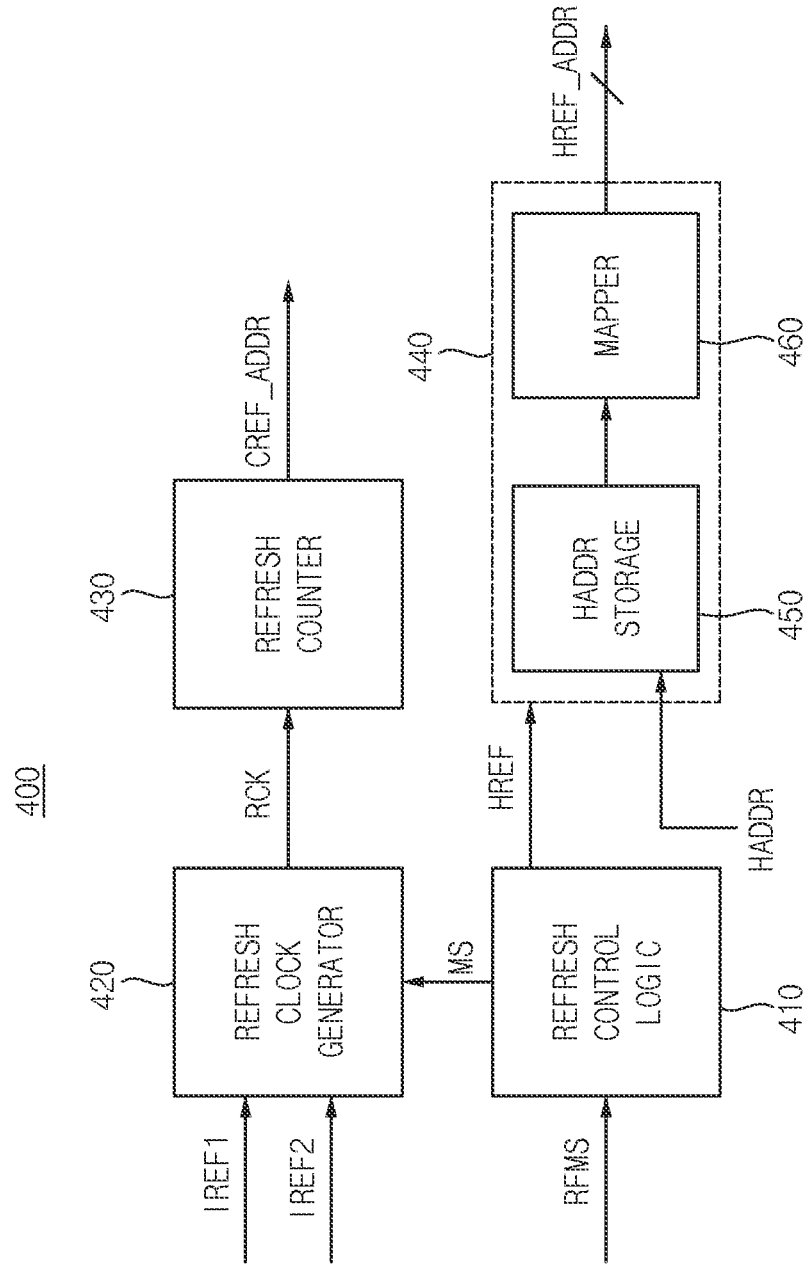
FIG. 5 is a block diagram illustrating an example of the refresh control circuit in FIG. 3 according to example embodiments.

FIG. 5 is a block diagram illustrating an example of the refresh control circuit in FIG. 3 according to example embodiments.

Referring to FIG. 5, the refresh control circuit 400 may include a refresh control logic 410, a refresh clock generator 420, a refresh counter 430 and a hammer refresh address generator 440.

The refresh control logic 410 may provide a mode signal MS in response to a refresh management signal RFMS. In addition, the refresh control logic 410 may provide the hammer refresh address generator 440 with a hammer refresh signal HREF to control output timing of the hammer address in response to one of the first refresh control signal IREF1 or the second refresh control signal IREF2.

The control logic circuit 210 in FIG. 3 may provide the refresh control circuit 400 with the refresh management signal RFMS based on a refresh management command from the memory controller 30.

The refresh clock generator 420 may generate a refresh clock signal RCK indicating a timing of a normal refresh operation based on the first refresh control signal IREF1, the second refresh control signal IREF2 and the mode signal MS. The refresh clock generator 420 may generate the refresh clock signal RCK in response to receiving the first refresh control signal IREF1 or while the second refresh control signal IREF2 is activated. When the command CMD from the memory controller 30 corresponds to an auto refresh command, the control logic circuit 210 in FIG. 3 may apply the first refresh control signal IREF1 to the refresh control circuit 400 whenever the control logic circuit 210 receives the auto refresh command. When the command CMD from the memory controller 30 corresponds to a self-refresh entry command, the control logic circuit 210 may apply the second refresh control signal IREF2 to the refresh control circuit 400 and the second refresh control signal IREF2 is activated from a time point when the control logic circuit 210 receives the self-refresh entry command to a time point when control logic circuit 210 receives a self-refresh exit command.

The refresh counter 430 may generate a counter refresh address CREF_ADDR designating sequentially the memory cell rows by performing counting operation at the period of the refresh clock signal RCK, and may provide the counter refresh address CREF_ADDR as the refresh row address REF_ADDR to the row address multiplexer 240 in FIG. 3. For example, the refresh counter 430 may generate the counter refresh address CREF_ADDR, and the counter refresh address CREF_ADDR may be associated with a normal refresh operation on the memory cell rows (e.g., by being provided as the refresh row address REF_ADDR to the row address multiplexer 240).

The hammer refresh address generator 440 may include a hammer address storage 450 and a mapper 460.

The hammer address storage 450 may store the hammer address HADDR and may output the hammer address HADDR to the mapper 460 in response to the hammer refresh signal HREF. The mapper 460 may generate hammer refresh addresses HREF_ADDR designating one or more victim memory cell rows physically adjacent to a memory cell row corresponding to the hammer address HADDR.

The hammer refresh address generator 440 may provide the hammer refresh address HREF_ADDR as the refresh row address REF_ADDR to the row address multiplexer 240 in FIG. 3.

Figure 6:
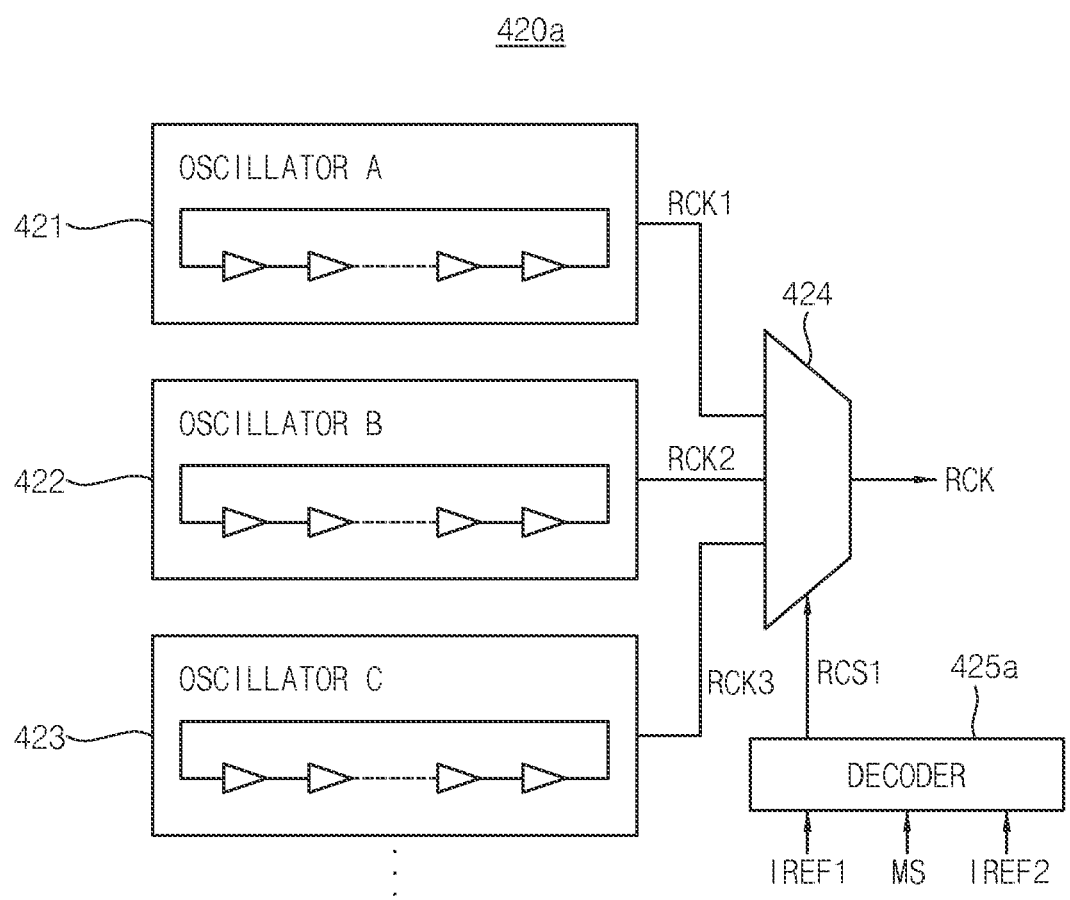
FIG. 6 is a circuit diagram illustrating an example of the refresh clock generator shown in FIG. 5 according to example embodiments.

FIG. 6 is a circuit diagram illustrating an example of the refresh clock generator shown in FIG. 5 according to example embodiments.

Referring to FIG. 6, a refresh clock generator 420a may include a plurality of oscillators 421, 422 and 423, a multiplexer 424 and a decoder 425a. The decoder 425a may decode the first refresh control signal IREF1, the second refresh control signal IREF2 and the mode signal MS to output a clock control signal RCS1. The oscillators 421, 422, and 423 may generate refresh clock signals RCK1, RCK2 and RCK3 having different periods. The multiplexer 424 may select one of the refresh clock signals RCK1, RCK2 and RCK3 to provide the refresh clock signal RCK in response to the clock control signal RCS1.

Because the mode signal MS indicates that the row hammer event occurs, the refresh clock generator 420a may adjust a refresh cycle by selecting one of the refresh clock signals RCK1, RCK2 and RCK3.

Figure 7:
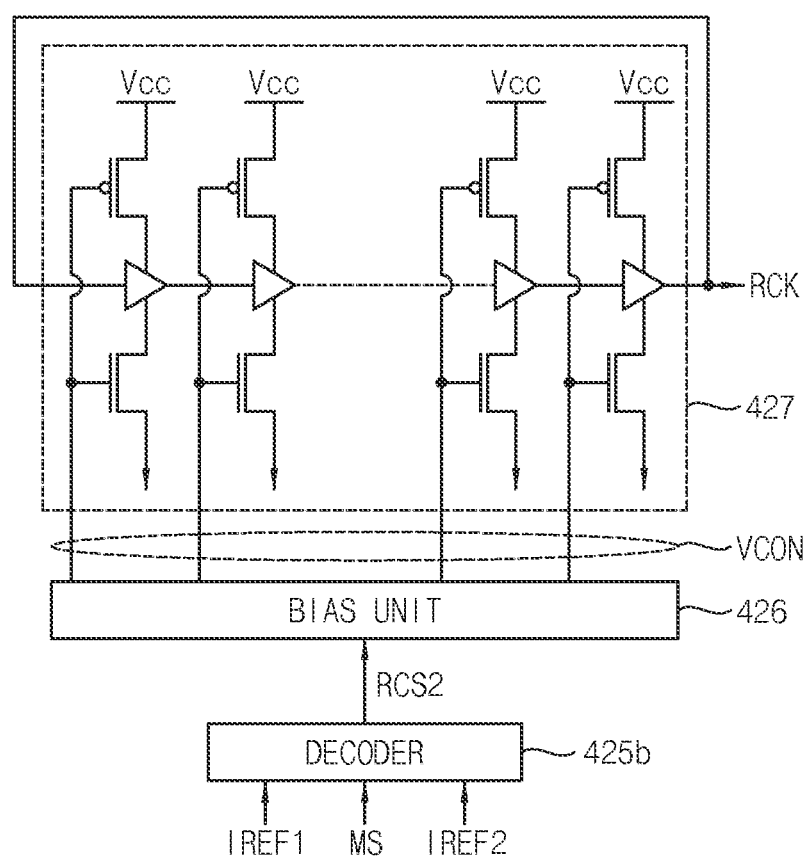
FIG. 7 is a circuit diagram illustrating another example of the refresh clock generator in FIG. 5 according to example embodiments.

FIG. 7 is a circuit diagram illustrating another example of the refresh clock generator in FIG. 5 according to example embodiments.

Referring to FIG. 7, a refresh clock generator 420b may include a decoder 425b, a bias unit 426 and an oscillator 427.

The oscillator 427 may include a plurality of delay cells connected in series. Each of the plurality of delay cells may be connected between a power supply voltage Vcc and a ground voltage and each of the plurality of delay cells may include a p-channel metal-oxide semiconductor (PMOS) transistor, a buffer and an n-channel metal-oxide semiconductor (NMOS) transistor connected in series between the power supply voltage Vcc and the ground voltage.

The decoder 425b may decode the first refresh control signal IREF1, the second refresh control signal IREF2 and the mode signal MS to output a clock control signal RCS2. The bias unit 426 may generate a control voltage VCON in response to the clock control signal RCS2. The oscillator 427 may generate the refresh clock signal RCK having a variable period, according to the control voltage VCON applied to gates of the PMOS transistors and the NMOS transistors.

Because the mode signal MS indicates that the refresh management signal RFMS (see FIG. 5) has been received (that is, the row hammer event occurs), the refresh clock generator 420b may adjust a refresh cycle by varying a period of the refresh clock signal RCK based on the clock control signal RCS2.

Figure 8:
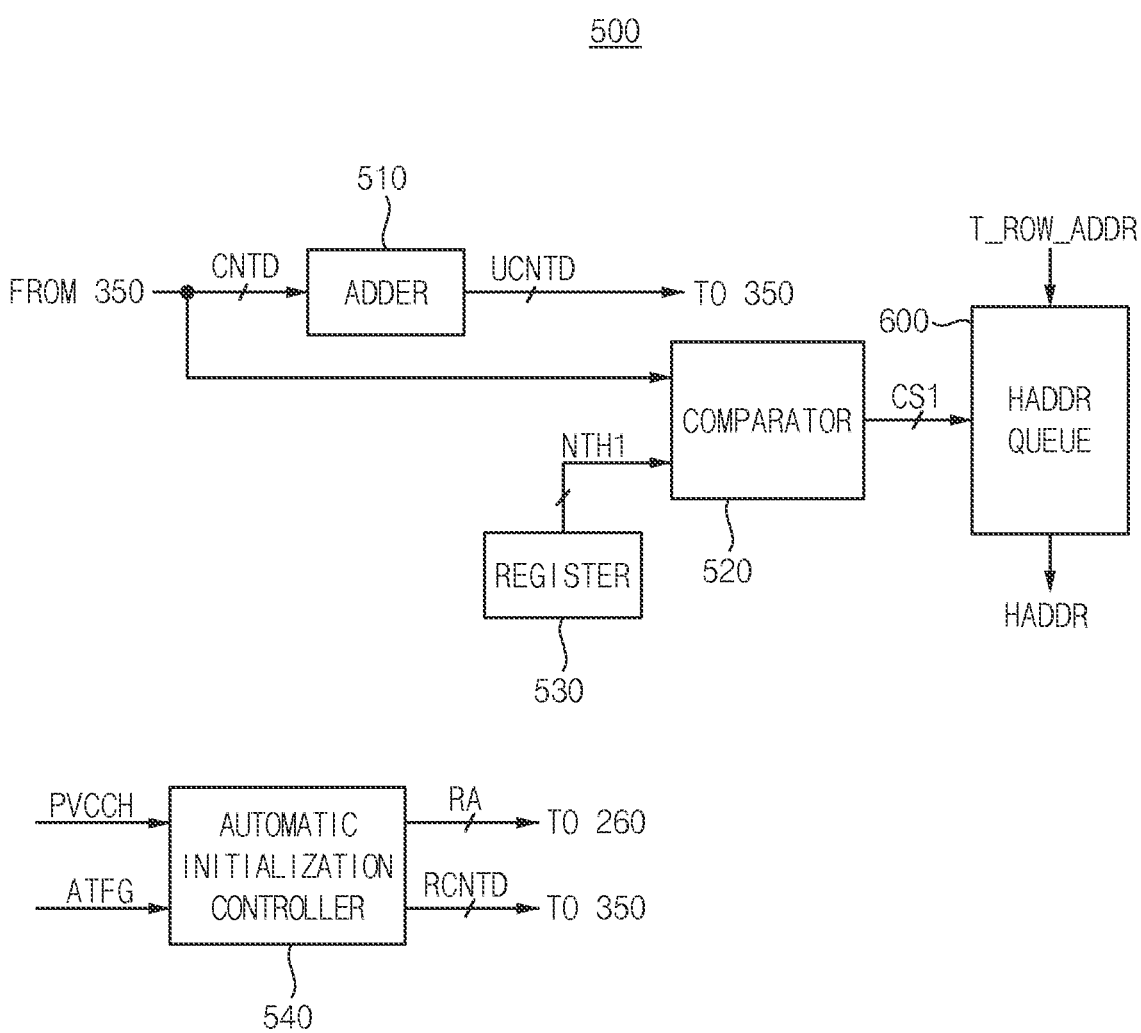
FIG. 8 is a block diagram illustrating an example of the row hammer management circuit in the semiconductor memory device of FIG. 3 according to example embodiments.

FIG. 8 is a block diagram illustrating an example of the row hammer management circuit in the semiconductor memory device of FIG. 3 according to example embodiments.

Referring to FIG. 8, the row hammer management circuit 500 may include an adder 510, a comparator 520, a register 530, an automatic initialization controller 540 and a hammer address queue 600.

The adder 510 may update the count data CNTD read from the count cells of the target memory cell row to provide an updated count data UCNTD by increasing the count data CNTD by one, which is read from the count cells of the target memory cell row and an ECC decoding operation is performed on. The adder 510 may update the read count data CNTD. The adder 510 may be implemented with an up-counter.

The updated count data UCNTD is provided to the ECC engine 350 and the ECC engine 350 may perform an ECC encoding operation on the updated count data UCNTD.

The register 530 may store a reference number of times NTH1. The comparator 520 may compare the read count data CNTD with the reference number of times NTH1 to output a first comparison signal CS1 indicating a result of the comparison.

The reference number of times NTH1 may include default reference number of times and multiples of the default reference number of times and thus, the first comparison signal CS1 may include a plurality of bits.

The hammer address queue 600, in response to the first comparison signal CS1 indicating that the read count data CNTD is equal to greater than the reference number of times NTH1, may store a target access address T_ROW_ADDR designating the target memory cell row as a candidate hammer address and may provide the refresh control circuit 400 in FIG. 3 with one of candidate hammer addresses stored therein as the hammer address HADDR. The hammer address queue 600 may store the target access addresses T_ROW_ADDR whose number of times of access is equal to or greater than the reference number of times NTH1 as the candidate hammer addresses and may indicate a state of the hammer address queue 600 as a logic level of the alert signal ALRT based on a number of the candidate hammer addresses stored therein.

The automatic initialization controller 540 may generate the random count data RCNTD and row addresses RA designating each of the memory cell rows based on the power stabilizing signal PVCCH and the anti-fuse flag signal ATFG during the power-up sequence of the semiconductor memory device 200, may store the random count data RCNTD in the count cells through the ECC engine 350 and may provide the row addresses RA to the row decoder 260 in FIG. 3.

FIG. 9 illustrates an example of the automatic initialization controller in the row hammer management circuit of FIG. 8 according to example embodiments.

Referring to FIG. 9, the automatic initialization controller 540 may include a signal generator 545, an interval signal generator 550, a timing generator 555, a row address generator 560, a random seed generator 570 and a random count data generator 590.

The signal generator 545 may generate a random initialization signal RAD_INIT based on the anti-fuse flag signal ATFG. The interval signal generator 550 may generate an interval signal PRHT_INIT that is activated during a first time interval, based on the random initialization signal RAD_INIT. The interval signal generator 550 may include a set terminal S to receive the random initialization signal RAD_INIT and a reset terminal R to receive a completion signal DONE.

The timing generator 555 may generate an active signal IACT2, an active interval signal PRD and a write signal IWR2 based on the interval signal PRHT_INIT. The row address generator 560 may generate the row addresses RA based on the active signal IACT2, may generate the completion signal DONE in response to generating the row addresses RA being completed, may provide the row addresses RA to the row decoder 260 in FIG. 3 and may provide the completion signal DONE to the interval signal generator 550. For example, the row address generator 560 may generate the row addresses RA based on the active signal IACT2, and may generate the completion signal DONE in response to being done with generating the row addresses.

In example embodiments, the row address generator 560 may generate abbreviated row addresses RA_AB by omitting at least one upper bit of the row addresses RA. When one upper bit of the row addresses RA is omitted, the abbreviated row addresses RA_AB may designate two memory cell rows in different sub array blocks and when two upper bits of the row addresses RA is omitted, the abbreviated row addresses RA_AB may designate four memory cell rows in different sub array blocks.

The random seed generator 570 may generate a random seed RSD based on the power stabilizing signal PVCCH and selectively based on the anti-fuse flag signal ATFG. The random count data generator 590 may generate the random count data RCNTD based on the random seed RSD, may store the random count data RCNTD in the count cells of each of the memory cell rows through the ECC engine 350 (see FIG. 3) or may store the random count data RCNTD in the count cells of each of the memory cell rows directly.

In example embodiments, the row address generator 560 may generate the row addresses RA sequentially and the random count data generator 590 may generate the random count data RCNTD randomly. That is, the random count data generator 590 may generate the random count data RCNTD such that it that varies randomly.

In example embodiments, the row address generator 560 may generate the row addresses RA randomly such that the row addresses RA are not overlapped with respect to each other and the random count data generator 590 may generate the random count data RCNTD sequentially.

Figure 10A:
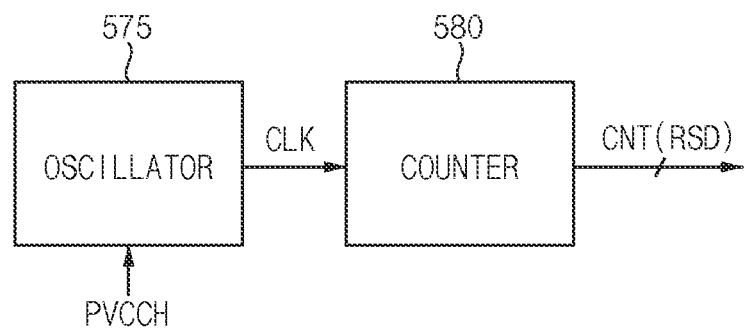
FIG. 10A is a block diagram illustrating an example of the random seed generator in the automatic initialization controller of FIG. 9 according to example embodiments.

FIG. 10A is a block diagram illustrating an example of the random seed generator in the automatic initialization controller of FIG. 9 according to example embodiments.

Referring to FIG. 10A, a random seed generator 570a may include an oscillator 575 and a counter 580.

The oscillator 575 may operate in the power-up sequence in response to the power stabilizing signal PVCCH to generate a clock signal CLK toggling with a first frequency. The counter 580 may generate a counting signal CNT including a plurality of counting bits by counting the clock signal CLK and may provide the counting signal CNT as the random seed RSD. The oscillator 575 operates in response to a transition of the power stabilizing signal PVCCH. Because a transition point of the power stabilizing signal PVCCH may vary depending on a manufacturing process of the semiconductor memory device 200, applied voltage, and operating temperature, the counting signal CNT may have randomness and the randomness may not be identified outside of the semiconductor memory device 200.

Figure 10B:
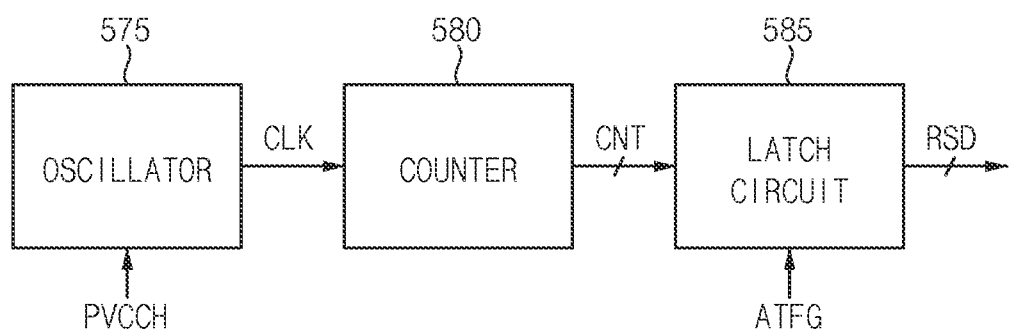
FIG. 10B is a block diagram illustrating an example of the random seed generator in the automatic initialization controller of FIG. 9 according to example embodiments.

FIG. 10B is a block diagram illustrating an example of the random seed generator in the automatic initialization controller of FIG. 9 according to example embodiments.

Referring to FIG. 10B, a random seed generator 570b may include an oscillator 575, a counter 580 and a latch circuit 585.

The oscillator 575 may operate in the power-up sequence in response to the power stabilizing signal PVCCH to generate a clock signal CLK toggling with a first frequency. The counter 580 may generate a counting signal CNT including a plurality of counting bits by counting the clock signal CLK and may provide the counting signal CNT to the latch circuit 585. The latch circuit 585 may latch the counting signal CNT based on the anti-fuse flag signal ATFG to provide the random seed RSD.

A frequency of the clock signal CLK may be very short, and the anti-fuse flag signal ATFG may transition from a high level to a low level in a time domain associated with a frequency which may be much greater than a time domain associated with the frequency of the clock signal CLK.

Therefore, a logic level of the counting bits of the counting signal CNT latched in response to anti-fuse flag signal ATFG transitioning to a low level may vary depending on a manufacturing process of the semiconductor memory device 200, applied voltage and operating temperature. Therefore, the counting signal CNT may have randomness and the randomness may not be identified outside of the semiconductor memory device 200.

Figure 11:
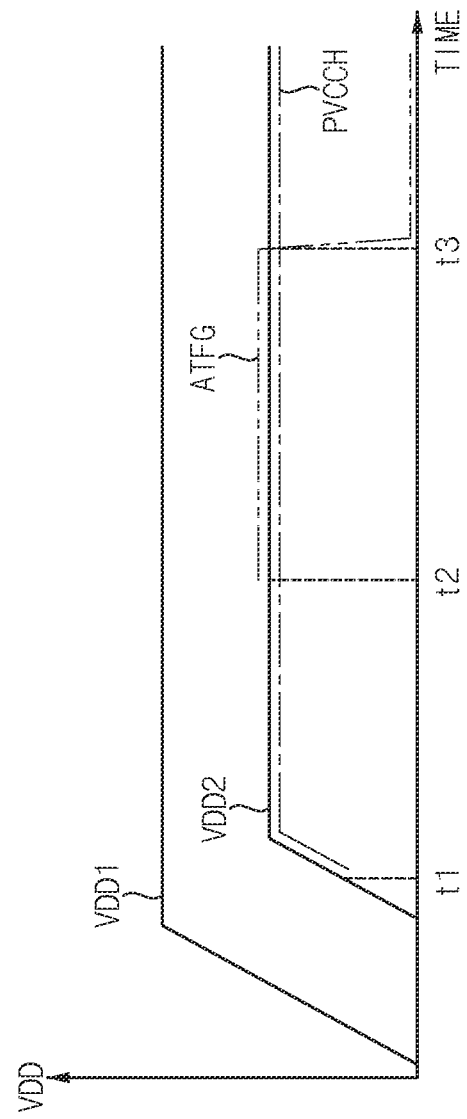
FIG. 11 is a timing diagram illustrating an operation of the random seed generator of FIG. 10A or FIG. 10B according to example embodiments.

FIG. 11 is a timing diagram illustrating an operation of the random seed generator of FIG. 10A or FIG. 10B according to example embodiments.

Referring to FIGS. 10A, 10B and 11, an external voltage VDD may be applied to the voltage generator 385 (see FIG. 3) during a power-up sequence of the semiconductor memory device 200, and the voltage generator 385 may generate operating voltages VDD1 and VDD2 based on the external voltage VDD. The voltage generator 385 may transition the power stabilizing signal PVCCH to a high level in response to the operating voltage VDD1 reaching a reference voltage level at a time point t1.

The oscillator 575 may begin to oscillate in response to the power stabilizing signal PVCCH transitioning to the high level and may output the clock signal CLK toggling with a first frequency. At a time point t2, information associated with an anti-fuse circuit of the semiconductor memory device 200 may begin to be transferred to the anti-fuse circuits, and the anti-fuse flag signal ATFG may transition to a high level. At a time point t3, the transferring of the information associated with the anti-fuse circuits to the anti-fuse circuits may be completed, and the anti-fuse flag signal ATFG may transition to a low level. The latch circuit 585 may latch the first counting signal CNT in response to the anti-fuse flag signal ATFG transitioning to a low level and may provide the latched counting signal CNT as the random seed RSD. Therefore, the counting bits of the counting signal CNT may be provided at the time point t3 as the random seed RSD.

Figure 12A:
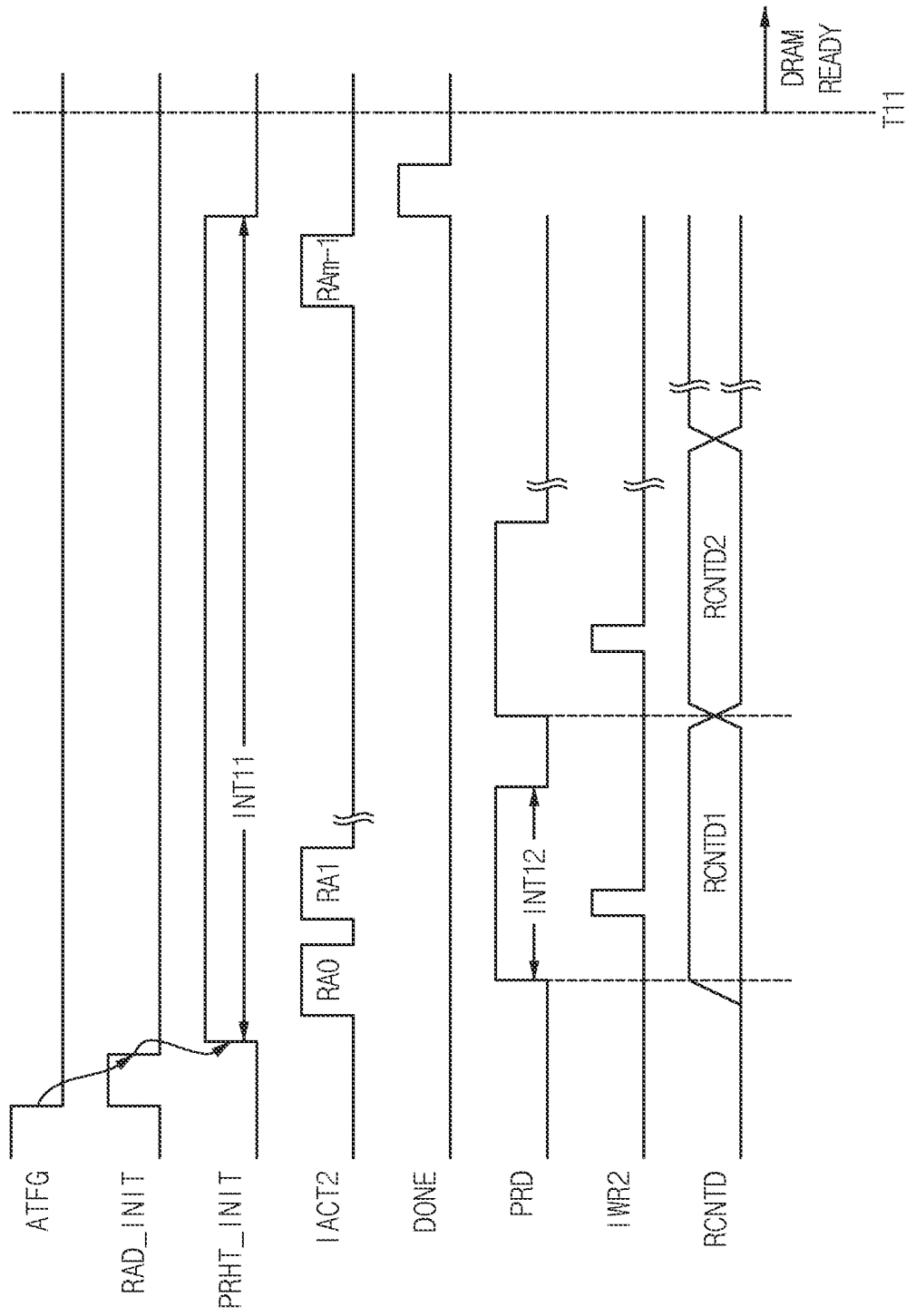
FIG. 12A is a timing diagram illustrating an operation of the automatic initialization controller of FIG. 9 according to example embodiments.

FIG. 12A is a timing diagram illustrating an operation of the automatic initialization controller of FIG. 9 according to example embodiments.

Referring to FIGS. 9 and 12A, the signal generator 545 may activate the random initialization signal RAD_INIT during a specific time interval in response to a falling transition (e.g., falling edge) of the anti-fuse flag signal ATFG and may deactivate the random initialization signal RAD_INIT, and the interval signal generator 550 may activate the interval signal PRHT_INIT during a first time interval INT11 in response to a falling transition of the random initialization signal RAD_INIT. The interval signal generator 550 may activate the interval signal PRHT_INIT in response to a falling transition of the random initialization signal RAD_INIT and may deactivate the interval signal PRHT_INIT in response to an activation of the completion signal DONE.

The row address generator 560 may generate the row addresses RA0, RA1, ..., RAm−1 based on the active signal IACT2, activate the completion signal DONE in response to the generating of the row addresses RA0, RA1, RAm−1 being completed, provide the row addresses RA0, RA1, RAm−1 to one of the first through sixteenth row decoders 260a~260p in FIG. 3 and provide the completion signal DONE to the interval signal generator 550.

The timing generator 555 may generate the active signal IACT2 such that row addresses RA0, RA1, ..., RAm−1 are sequentially generated, generate the active interval signal PRD such that word-lines coupled to memory cell rows designated by the row addresses RA0, RA1, ..., RAm−1 are sequentially enabled during a second time interval INT12 and activate the write signal IWR2 within an activation interval of the active interval signal PRD.

Therefore, random count data RCNTD1, RCNTD2, ... may be sequentially stored in count cells of each of the memory cell rows designated by the row addresses RA0, RA1, ..., RAm−1 in response to the write signal IWR2 during the power-up sequence. From a time point T11 after storing the random count data RCNTD1, RCNTD2, ... in the count cells of each of the memory cell rows designated by the row addresses RA0, RA1, ..., RAm−1 is completed, the semiconductor memory device 200 may receive a command from the memory controller 30 as denoted by 'DRAM READY'.

FIG. 12B is a timing diagram illustrating an operation of the automatic initialization controller of FIG. 9 according to example embodiments.

Referring to FIGS. 9 and 12B, the signal generator 545 may activate the random initialization signal RAD_INIT during a specific time interval in response to a falling transition of the anti-fuse flag signal ATFG and may deactivate the random initialization signal RAD_INIT, and the interval signal generator 550 may activate the interval signal PRHT_INIT during a first time interval INT11 in response to a falling transition of the random initialization signal RAD_INIT. The interval signal generator 550 may activate the interval signal PRHT_INIT in response to a falling transition of the random initialization signal RAD_INIT and may deactivate the interval signal PRHT_INIT in response to an activation of the completion signal DONE.

The row address generator 560 may generate the row addresses RA0, RA1, ..., RAm−1 based on the active signal IACT2, activate the completion signal DONE in response to the generating of the row addresses RA0, RA1, ..., RAm−1 being completed, provide the row addresses RA0, RA1, ..., RAm−1 to the first through sixteenth row decoders 260a~260p in FIG. 3 and provide the completion signal DONE to the interval signal generator 550.

Therefore, random count data RCNTD1, RCNTD2, ... may be sequentially stored in count cells of each of the memory cell rows designated by the row addresses RA0, RA1, ..., RAm−1 in response to the write signal IWR2 during the power-up sequence in each of the first through sixteenth bank arrays 310a~310p. Therefore, a time interval associated with writing the random count data may be reduced.

Figure 12C:
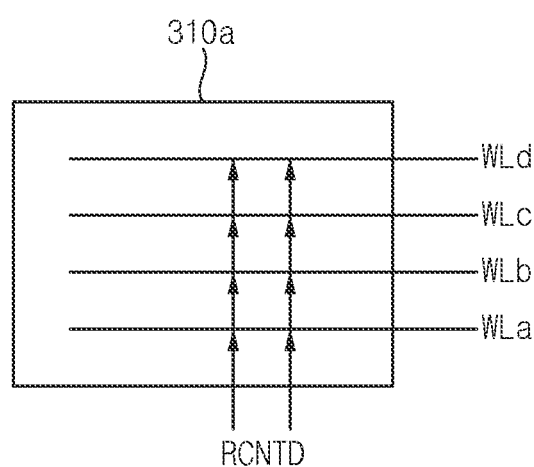
FIG. 12C illustrates a bank array when the row address generator in the automatic initialization controller of FIG. 9 generates abbreviated row addresses.

FIG. 12C illustrates a bank array when the row address generator in the automatic initialization controller of FIG. 9 generates abbreviated row addresses.

Referring to FIGS. 9 and 12C, when the row address generator 560 generates the abbreviated row addresses RA_AB by omitting two upper bits of the row addresses RA and provides the abbreviated row addresses RA_AB to the first row decoder 260a in FIG. 3, the first row decoder 260a may simultaneously enable a plurality of word-lines WLa, WLb, WLc and WLd that belong to different sub array blocks in the first bank array 310a and do not share a bit-line sense amplifier. When the plurality of word-lines WLa, WLb, WLc and WLd are simultaneously enabled, the random count data RCNTD may be stored in parallel in count cells in each of memory cell rows coupled to the plurality of word-lines WLa, WLb, WLc and WLd and a time interval associated with writing the random count data RCNTD may be reduced. For example, the row hammer management circuit may store the random count data RCNTD in count cells of each of the memory cell rows of the first bank array 310a in parallel during a power-up sequence of the semiconductor memory device.

Figure 13:
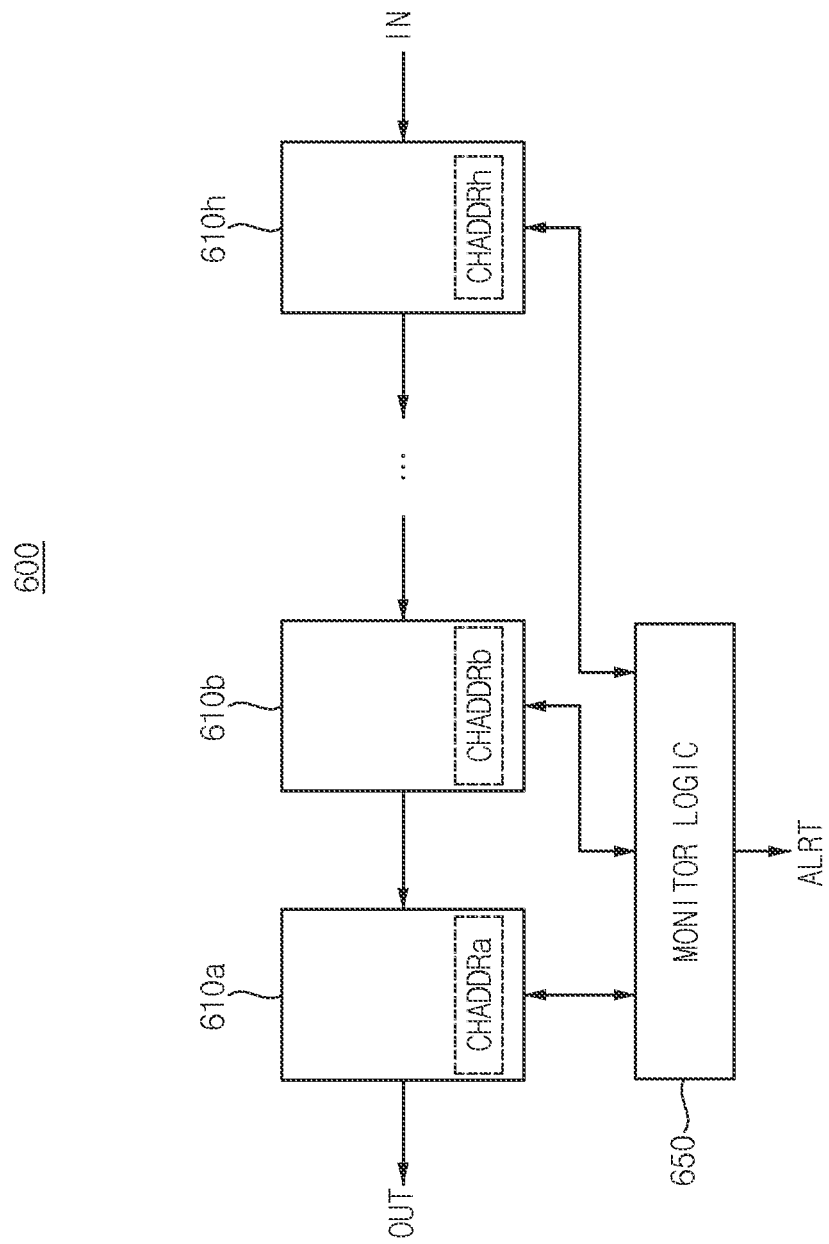
FIG. 13 illustrates an example of the hammer address queue in the row hammer management circuit of FIG. 8 according to example embodiments.

FIG. 13 illustrates an example of the hammer address queue in the row hammer management circuit of FIG. 8 according to example embodiments.

Referring to FIG. 13, the hammer address queue 600 may include a plurality of FIFO registers 610a, 610b, , ..., 610h, and a monitor logic 650. A number of the plurality of FIFO registers 610a, 610b, , ..., 610h may correspond to a first number.

The plurality of FIFO registers 610a, 610b, , ..., 610h may store a plurality of candidate hammer addresses CHADDRa, CHADDRb, , CHADDRh up to the first number based on FIFO scheme from an input terminal IN to an output terminal OUT. One of the plurality of candidate hammer addresses CHADDRa, CHADDRb, ..., CHADDRh that is stored first in one of the plurality of FIFO registers 610a, 610b, , ..., 610h may be a first candidate hammer address (e.g., CHADDRa).

The monitor logic 650 may be connected to the plurality of FIFO registers 610a, 610b, , ..., 610h, may manage the plurality of FIFO registers 610a, 610b, , ..., 610h and may monitor whether each of the plurality of FIFO registers 610a, 610b, , ..., 610h stores a candidate hammer address. In response to the number of the candidate hammer addresses stored in the plurality of FIFO registers 610a, 610b, , ..., 610h reaching the first number (that is, in response to the plurality of FIFO registers being full), the monitor logic 650 may output a candidate hammer address that is input first of all from among the candidate hammer addresses as the hammer address HADDR and may notify the memory controller 30 of a state of the hammer address queue 600 by transiting a logic level of the alert signal ALRT from a first logic level to a second logic level different from the first logic level in response to outputting the hammer address HADDR. For example, the monitor logic 650 may output the first candidate hammer address (e.g., CHADDRa) as the hammer address HADDR in response to a number of the candidate hammer addresses CHADDRa, CHADDRb, ..., CHADDRh stored in the plurality of FIFO registers 610a, 610b, , ..., 610h reaching the first number (e.g., in response to the plurality of FIFO registers being full).

In response to a transition of the alert signal ALRT, the memory controller 30 of FIG. 2 applies a refresh management command to the semiconductor memory device 200, and the monitor logic 650 may transit the alert signal ALRT to the first logic level in response to the hammer refresh operation based on the hammer address HADDR is completed. That is, the monitor logic 650 may transit the alert signal ALRT to the first logic level in response to the hammer refresh operation after a predetermined time interval elapses from a time point at which the monitor logic 650 outputs the hammer address HADDR.

Figure 14:
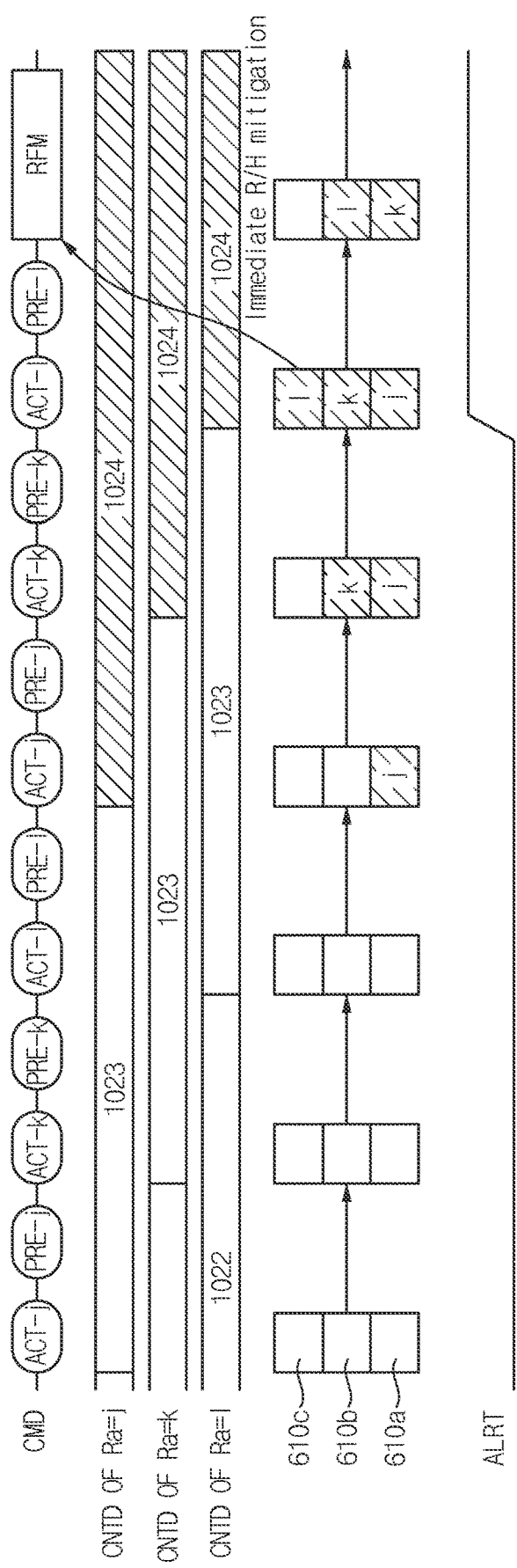
FIG. 14 is a timing diagram illustrating an example operation of the hammer address queue of FIG. 13 according to example embodiments.

FIG. 14 is a timing diagram illustrating an example operation of the hammer address queue of FIG. 13 according to example embodiments.

In FIG. 14, it is assumed that the plurality of FIFO registers 610a, 610b, , ..., 610h in FIG. 13 include three FIFO registers 610a, 610b and 610c and accesses on memory cell rows designated by a row address RA=j, a row address RA=k and a row address RA=l are repeated. In addition, it is assumed that the reference number of times NTH1 corresponds to 1024.

In FIG. 14, ACT-j denotes an active command accompanying the row address RA=j, PRE-j denotes a precharge command on a memory cell row designated by the row address RA=j, ACT-k denotes an active command accompanying the row address RA=k, PRE-k denotes a precharge command on a memory cell row designated by the row address RA=k, ACT-l denotes an active command accompanying the row address RA=l, and PRE-l denotes a precharge command on a memory cell row designated by the row address RA=l.

Referring to FIGS. 13 and 14, in response to the counted value (i.e., the count data CNTD) associated with the memory cell row designated by the row address RA=j reaching 1024, the row address RA=j is stored in the FIFO register 610a as a candidate hammer address, in response to the counted value (i.e., the count data CNTD) associated with the memory cell row designated by the row address RA=k reaching 1024, the row address RA=k is stored in the FIFO register 610b as a candidate hammer address, and in response to the counted value (i.e., the count data CNTD) associated with the memory cell row designated by the row address RA=l reaching 1024, the row address RA=l is stored in the FIFO register 610c as a candidate hammer address.

Because all of the FIFO registers 610a, 610b and 610c store candidate hammer addresses, the monitor logic 650 notifies the memory controller 30 of the hammer address queue 600 being full (that is, there being no available space in the hammer address queue 600) by transiting the alert signal ALRT to the second logic level. The memory controller 30, in response to transition of the alert signal ALRT, may withhold application of the active command to the semiconductor memory device 200 and may apply a refresh management command RFM to the semiconductor memory device 200. The monitor logic 650 may transit the alert signal ALRT from the first logic level (i.e., a logic high level) to the second logic level (i.e., a logic low level) in response to the row address RA=j stored in the FIFO register 610a being output as the hammer address.

The refresh control circuit 400 in FIG. 5 may perform a hammer refresh operation on one or more victim memory cell rows which are physically adjacent to a memory cell row corresponding to the hammer address and the monitor logic 650 may transit the alert signal ALRT to the first logic level after the hammer refresh operation is completed. The hammer refresh operation is represented by Immediate R/H mitigation in FIG. 14.

When the accesses on the row addresses RA=j, RA=k and RA=l are caused by a malicious hacker, overflow occurs in the hammer address queue 600 and performance of the semiconductor memory device 200 may be degraded.

Figure 15:
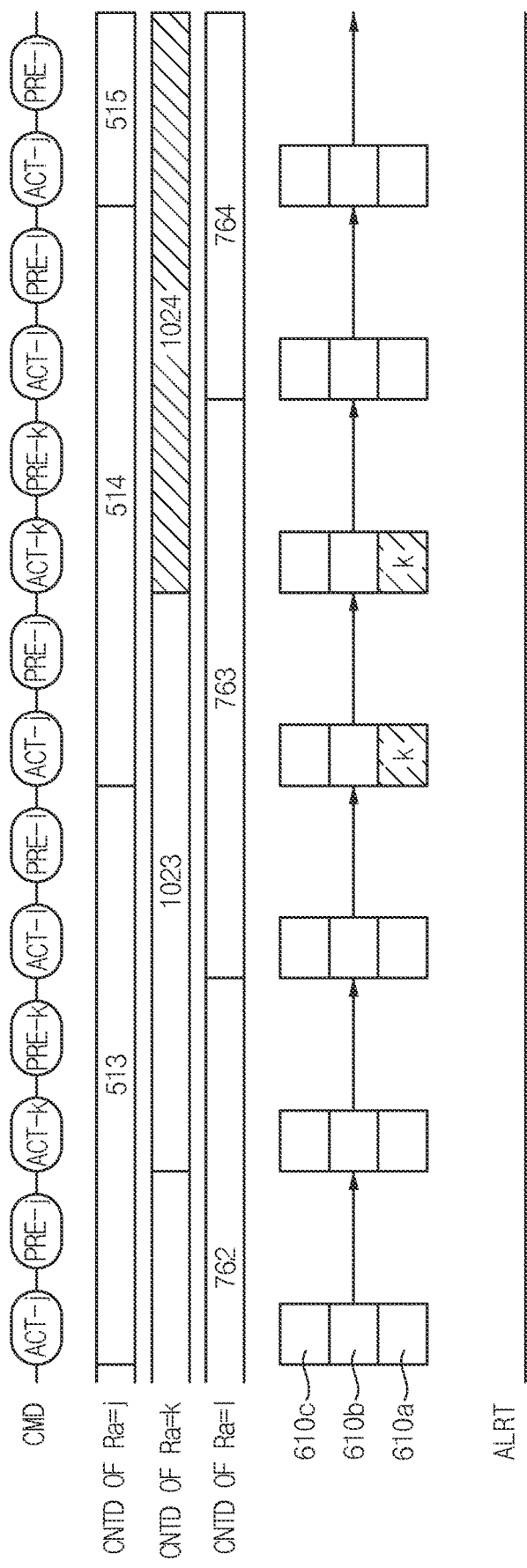
FIG. 15 is a timing diagram illustrating an example operation of the hammer address queue of FIG. 13 according to example embodiments.

FIG. 15 is a timing diagram illustrating an example operation of the hammer address queue of FIG. 13 according to example embodiments.

In FIG. 15, it is assumed that the plurality of FIFO registers 610a, 610b, . . . , 610h in FIG. 13 include three FIFO registers 610a, 610b and 610c and accesses on memory cell rows designated by a row address RA=j, a row address RA=k and a row address RA=l are repeated. In addition, it is assumed that the reference number of times NTH1 corresponds to 1024. In addition, it is assumed that the random count data is stored in count cells of memory cell rows designated by the row addresses RA=j, RA=k and RA=l during a power-up sequence of the semiconductor memory device 200.

Referring to FIGS. 13 and 15, in response to the counted value (i.e., the count data CNTD) associated with the memory cell row designated by the row address RA=k reaching 1024, the row address RA=k is stored in the FIFO register 610a as a candidate hammer address. However, because the random count data is stored in count cells of memory cell rows designated by the row addresses RA=j, RA=k and RA=l during a power-up sequence of the semiconductor memory device 200, the counted value (i.e., the count data CNTD) associated with the memory cell row designated by the row address RA=j corresponds to 514 and the counted value (i.e., the count data CNTD) associated with the memory cell row designated by the row address RA=l corresponds to 764. Therefore, overflow does not occur in the hammer address queue 600 and the alert signal ALRT may be maintained with the first logic level.

Figure 16:
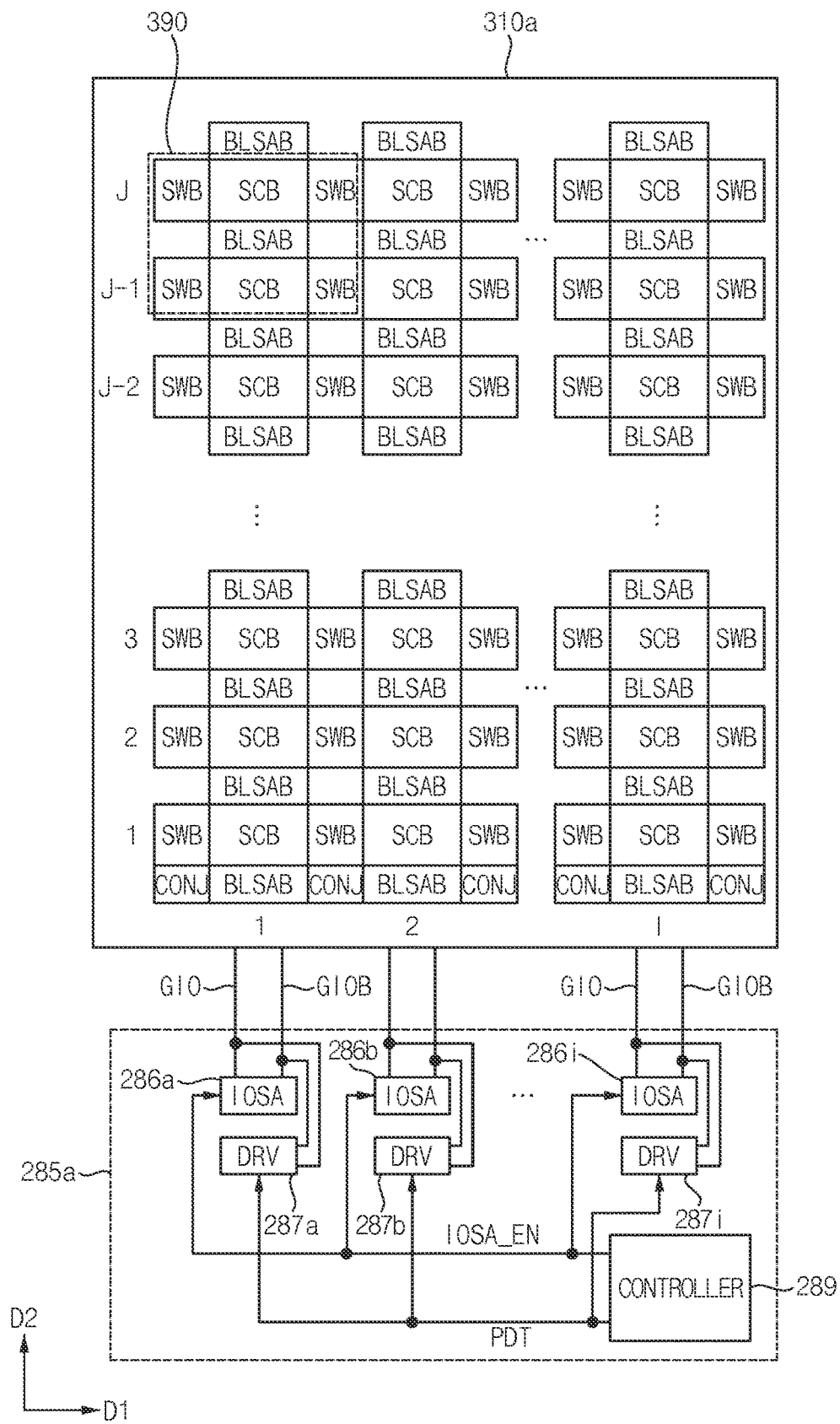
FIG. 16 illustrates the first bank array and the first sense amplifier in the semiconductor memory device of FIG. 3 according to some example embodiments.

FIG. 16 illustrates the first bank array and the first sense amplifier in the semiconductor memory device of FIG. 3 according to some example embodiments.

Referring to FIG. 16, in the first bank array 310a, I sub-array blocks SCB may be disposed in the first direction D1, and J sub-array blocks SCB may be disposed in the second direction D2 perpendicular to the first direction D1. I and J represent a number of the sub-array blocks SCB in the first direction D1 and the second direction D2, respectively, and are natural numbers greater than two.

I sub-array blocks SCB disposed in the first direction D1 in one row may be referred to as a row block. A plurality of bit-lines, a plurality of word-lines and a plurality of memory cells connected to the bit-lines and the word-lines are disposed in each of the sub-array blocks SCB.

I+1 sub word-line driver regions SWB may be disposed between the sub-array blocks SCB in the first direction D1 as well on each side of each of the sub-array blocks SCB in the first direction D1. Sub word-line drivers may be disposed in the sub word-line driver regions SWB. J+1 bit-line sense amplifier regions BLSAB may be disposed, for example, between the sub-array blocks SCB in the second direction D2 and above and below each of the sub-array blocks SCB in the second direction D2. Bit-line sense amplifiers to sense data stored in the memory cells may be disposed in the bit-line sense amplifier regions BLSAB.

A plurality of sub word-line drivers may be provided in each of the sub word-line driver regions SWB. One sub word-line driver region SWB may be associated with two sub-array blocks SCB adjacent to the sub word-line driver region SWB in the first direction D1.

A plurality of conjunction regions CONJ may be disposed adjacent the sub word-line driver regions SWB and the bit-line sense amplifier regions BLSAB. A voltage generator may be disposed in each of the conjunction regions CONJ.

The first sense amplifier 285a may be disposed in the second direction D2 with respect to the first bank array 310a and the first sense amplifier 285a may include I I/O sense amplifiers IOSAs 286a, 286b, . . . , 286i, I drivers DRVs 287a, 287b, . . . , 287i and a controller 289. The controller 289 may control the I I/O sense amplifiers 286a, 286b, . . . , 286i and the I drivers 287a, 287b, . . . , 287i by providing an enable signal IOSA_EN to the I I/O sense amplifiers 286a, 286b, . . . , 286i in a read operation and by providing a driving signal PDT to the I drivers DRVs 287a, 287b, . . . , 287i in a write operation.

A portion 390 in the first bank array 310a will be described with reference to FIG. 17 below.

Figure 17:
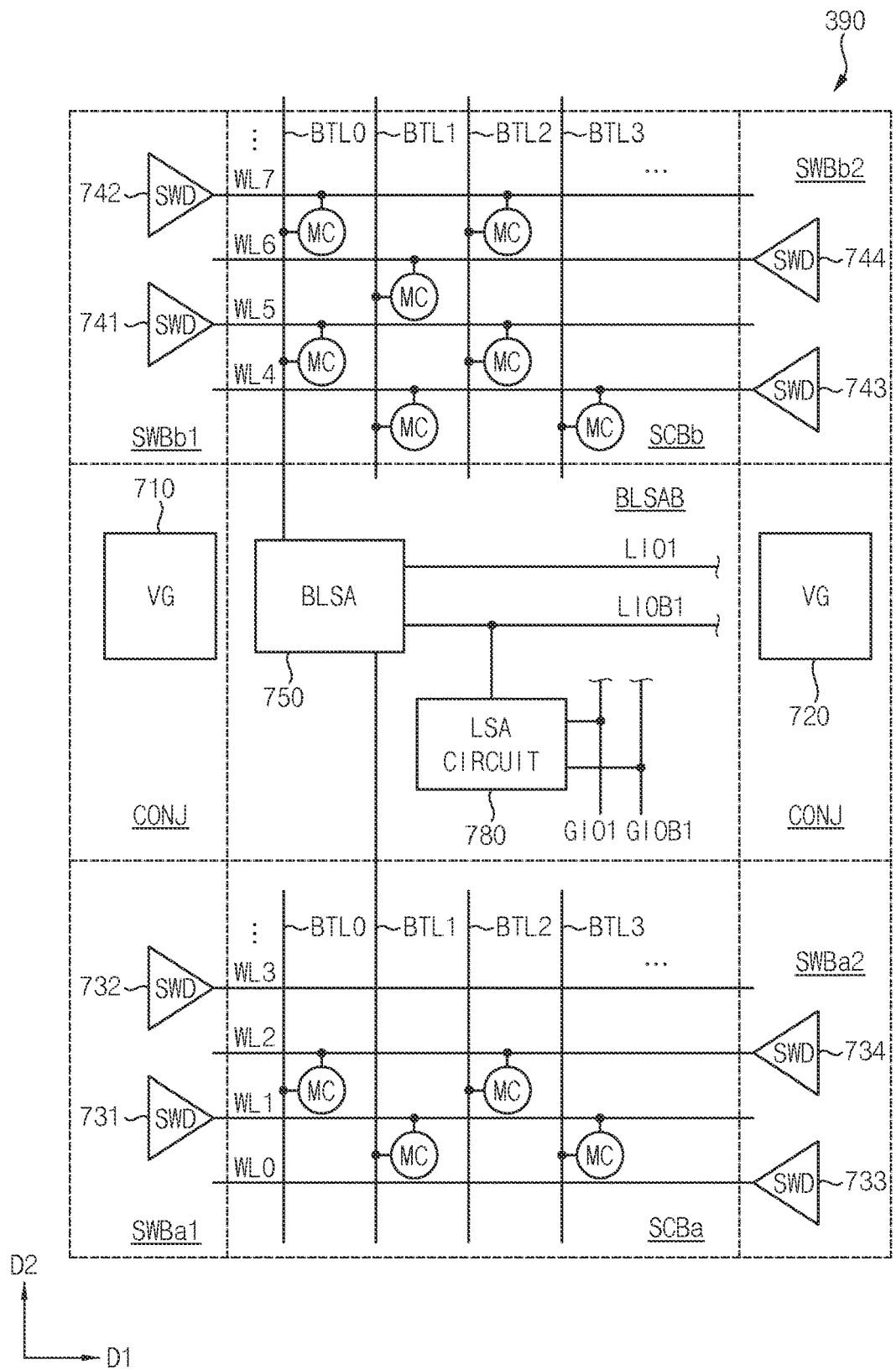
FIG. 17 illustrates a portion of the first bank array in FIG. 16 according to example embodiments.

FIG. 17 illustrates a portion of the first bank array in FIG. 16 according to example embodiments.

Referring to FIGS. 16 and 17, in the portion 390 of the first bank array 310a, sub-array blocks SCBa and SCBb, the bit-line sense amplifier regions BLSAB, four sub word-line driver regions SWBa1, SWBa2, SWBb1 and SWBb2 and two of the conjunction regions CONJ are disposed.

The sub-array block SCBa may include a plurality of word-lines WL0~WL3 extending in the first direction D1 and a plurality of bit-lines BTL0~BTL3 extending in the second direction D2. The sub-array block SCBa may include a plurality of memory cells MCs disposed at intersections of the word-lines WL0~WL3 and the bit-lines BTL0~BTL3. The sub-array block SCBb may include a plurality of word-lines WL4~WL7 extending in the first direction D1 and the plurality of bit-lines BTL0~BTL3 extending in the second direction D2. The sub-array block SCBb may include a plurality of memory cells MCs disposed at intersections of the word-lines WL4~WL7 and the bit-lines BTL0~BTL3.

With reference to FIG. 17, the sub word-line driver regions SWBa1 and SWBa2 may include a plurality of sub word-line drivers 731, 732, 733 and 734 that respectively drive the word-lines WL0~WL3. The sub word-line driver regions SWBb1 and SWBb2 may include a plurality of sub word-line drivers 741, 742, 743 and 744 that respectively drive the word-lines WL4~WL7.

The bit-line sense amplifier region BLSAB may include a bit-line sense amplifier BLSA 750 coupled to the bit-line BTL0 in the sub array block SCBb and the bit-line BTL1 in the sub array block SCBa, and a local sense amplifier LSA circuit 780. The bit-line sense amplifier 750 may sense and amplify a voltage difference between the bit-lines BTL0 and BTL1 to provide the amplified voltage difference to a local I/O line pair LIO1 and LIOB1.

The local sense amplifier circuit 780 may control electrical connection between the local I/O line pair LIO1 and LIOB1 and a global I/O line pair GIO1 and GIOB1.

As illustrated in FIG. 17, the conjunction regions CONJ may be disposed adjacent to the bit-line sense amplifier region BLSAB and the sub word-line driver regions SWBa1, SWBb1, SWBa2 and SWBb2. Voltage generators 710 and 720 may be disposed in the conjunction regions CONJ.

Figure 18:
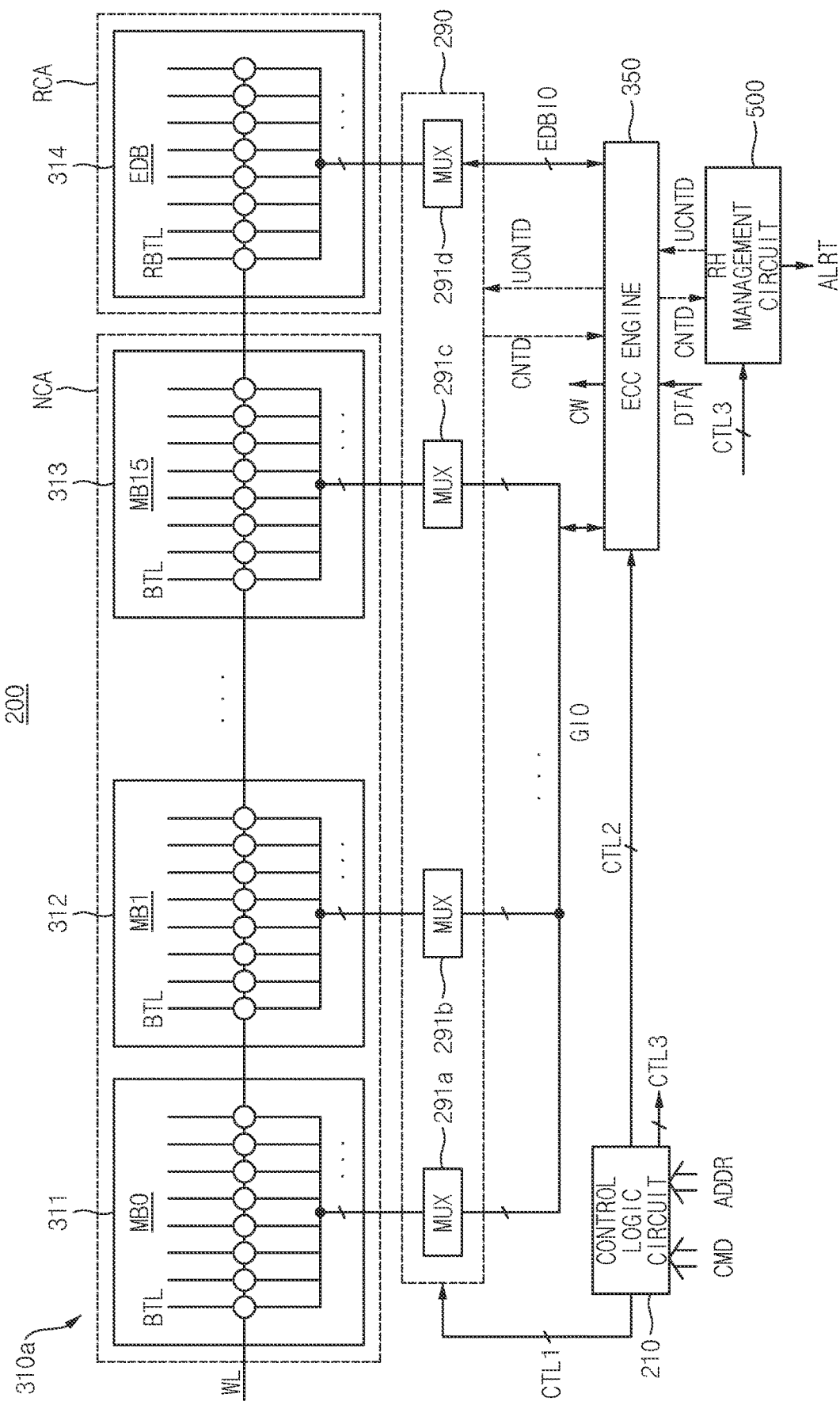
FIG. 18 illustrates a portion of the semiconductor memory device of FIG. 3 for explaining a write operation.

FIG. 18 illustrates a portion of the semiconductor memory device of FIG. 3 for explaining a write operation.

In FIG. 18, the control logic circuit 210, the first bank array 310a, the I/O gating circuit 290, the ECC engine 350 and the row hammer management circuit 500 are illustrated.

Referring to FIG. 18, the first bank array 310a includes a normal cell array NCA and a redundancy cell array RCA.

The normal cell array NCA includes a plurality of first memory blocks MB0~MB15, i.e., 311~313, and the redundancy cell array RCA includes at least a second memory block 314. The first memory blocks 311~313 are memory blocks that determine or are used to determine a memory capacity of the semiconductor memory device 200. The second memory block 314 is for ECC and/or redundancy repair. Since the second memory block 314 for ECC and/or redundancy repair is used for ECC, data line repair and block repair to repair 'failed' cells generated in the first memory blocks 311~313, the second memory block 314 is also referred to as an EDB block. Each of the first memory blocks 311~313 includes memory cells coupled to a word-line WL and bit-lines BTL and the second memory block 314 includes memory cells coupled to word-line WL and redundancy bit-lines RBTL. The first memory blocks 311~313 and the second memory block 314 may each be representative of a sub array block SCB in FIG. 16.

The I/O gating circuit 290 includes a plurality of switching circuits 291a~291d respectively connected to the first memory blocks 311~313 and the second memory block 314.

The ECC engine 350 may be connected to the switching circuits 291a~291d through first data lines GIO and second data lines EDBIO. The control logic circuit 210 may receive the command CMD and the address ADDR and may decode the command CMD to generate the first control signal CTL1 for controlling the switching circuits 291a~291d, the second control signal CTL2 for controlling the ECC engine 350 and the third control signal CTL3 for controlling the row hammer management circuit 500.

When the command CMD is a write command, the control logic circuit 210 provides the second control signal CTL2 to the ECC engine 350. The ECC engine 350 performs the ECC encoding on the data DTA to generate parity data associated with the data DTA and provides the I/O gating circuit 290 with the codeword CW including the data DTA and the parity data. The control logic circuit 210 provides the first control signal CTL1 to the I/O gating circuit 290 such that the codeword CW is to be stored in a sub-page of the target page in the first bank array 310a.

When the command CMD that is received after the write command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290.

That is, the ECC engine 350 and row hammer management circuit 500 may perform the internal read-update-write operation to read the count data CNTD, to update the read count data and to write the updated count data, in response to the active count update command. In addition, the row hammer management circuit 500, in response to all of the FIFO registers storing the candidate hammer addresses, each of whose number of times of access is equal to or greater than the reference number of times, may notify the memory controller 30 of states of the FIFO registers by transiting a logic level of the alert signal ALRT from the first logic level to the second logic level.

Figure 19:
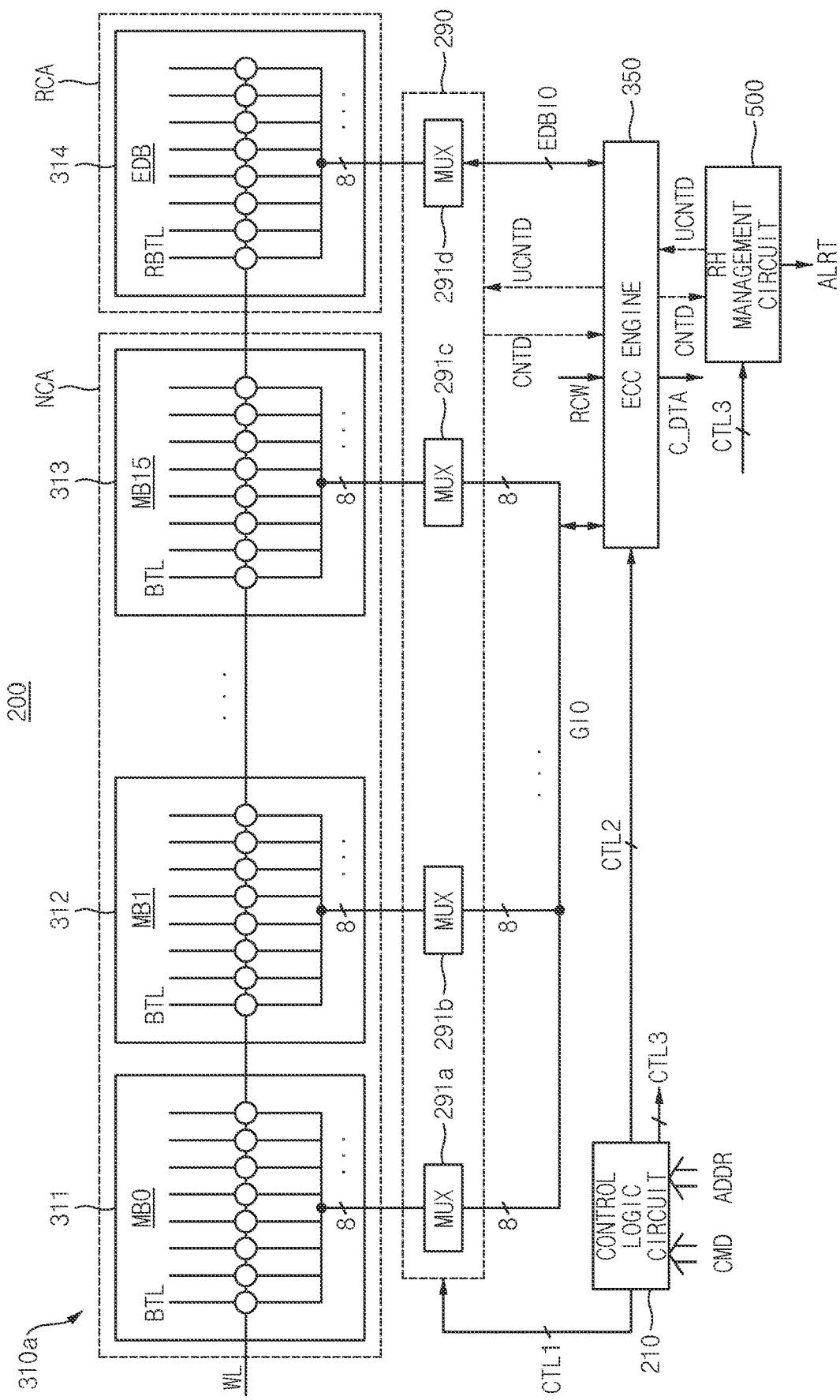
FIG. 19 illustrates a portion of the semiconductor memory device of FIG. 3 for explaining a read operation.

FIG. 19 illustrates a portion of the semiconductor memory device of FIG. 3 for explaining a read operation. Description repeated with FIG. 18 will be omitted.

Referring to FIG. 19, when the command CMD is a read command to designate a read operation, the control logic circuit 210 provides the first control signal CTL1 to the I/O gating circuit 290 such that a (read) codeword RCW stored in the sub-page of the target page in the first bank array 310a is provided to the ECC engine 350.

When the command CMD that is received after the read command corresponds to the active count update command, the control logic circuit 210 provides the first control signal CTL1 to the I/O gating circuit 290 such that the I/O gating circuit 290 reads the count data CNTD and a count parity data associated with the count data CNTD from the target page of the first bank array 310a and provides the count data CNTD and the count parity data to the ECC engine 350. The ECC engine 350 performs an ECC decoding operation on the count data CNTD and the count parity data, corrects an error bit in the count data CNTD and provides the count data CNTD as a corrected count data to the row hammer management circuit 500, based on the second control signal CTL2.

The row hammer management circuit 500 updates the count data CNTD to provide the updated count data UCNTD to the ECC engine 350. The ECC engine 350 performs an ECC encoding on the updated count data UCNTD to generate updated count parity data and stores the updated count data UCNTD and the updated count parity data in the target page through the I/O gating circuit 290.

That is, the ECC engine 350 and row hammer management circuit 500 may perform the internal read-update-write operation to read the count data CNTD, to update the read count data and to write the updated count data, in response to the active count update command. In addition, the row hammer management circuit 500, in response to all of the FIFO registers storing the candidate hammer addresses, each of whose number of times of access is equal to or greater than the reference number of times, may notify the memory controller 30 of states of the FIFO registers by transiting a logic level of the alert signal ALRT from the first logic level to the second logic level.

Figure 20:
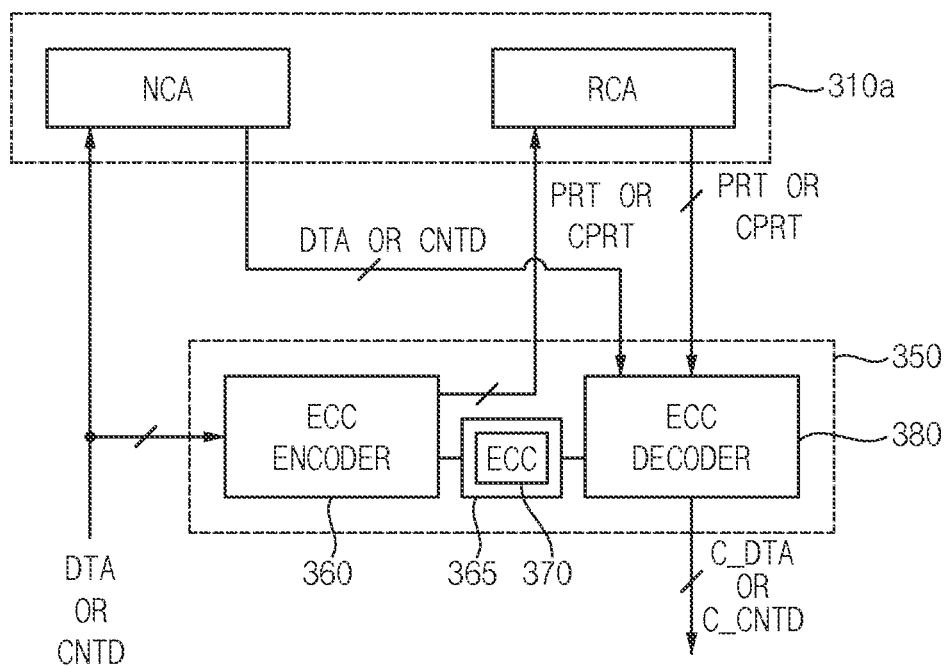
FIG. 20 is a block diagram illustrating an example of the ECC engine in the semiconductor memory device of FIG. 18 or FIG. 19 according to example embodiments.

FIG. 20 is a block diagram illustrating an example of the ECC engine in the semiconductor memory device of FIG. 18 or FIG. 19 according to example embodiments.

Referring to FIG. 20, the ECC engine 350 may include an ECC encoder 360, an ECC decoder 380 and a (ECC) memory 365. The memory 365 may store an ECC 370. The ECC 370 may be a single error correction (SEC) code or a single error correction/double error detection (SECDED) code.

The ECC encoder 360 may receive the data DTA from the data I/O buffer 320 (see FIG. 3) and generate parity data PRT using the ECC 370, associated with the data DTA to be stored in the normal cell array NCA of the first bank array 310a. The parity data PRT may be stored in the redundancy cell array RCA of the first bank array 310a. In addition, the ECC encoder 360 may receive the count data CNTD as an updated count data UCNTD from the row hammer management circuit 500 and generate count parity data CPRT using the ECC 370, associated with the count data CNTD (i.e., updated count data UCNTD) to be stored in the normal cell array NCA of the first bank array 310a. The count parity data CPRT may be stored in the redundancy cell array RCA of the first bank array 310a.

The ECC decoder 380 may perform an ECC decoding operation on a read data DTA based on the read data DTA and the parity data PRT read from the first bank array 310a using the ECC 370. When the read data DTA includes an error bit as a result of the ECC decoding, the ECC decoder 380 may correct the error bit in the read data DTA and may provide a corrected data C DTA to the data I/O buffer 320.

In addition, the ECC decoder 380 may perform an ECC decoding operation on the count data CNTD based on the count data CNTD and the count parity data CPRT read from the first bank array 310a using the ECC 370. When the count data CNTD includes an error bit as a result of the ECC decoding, the ECC decoder 380 may correct the error bit in the count data CNTD and may provide a corrected count data C CNTD to the row hammer management circuit 500.

Figure 21:
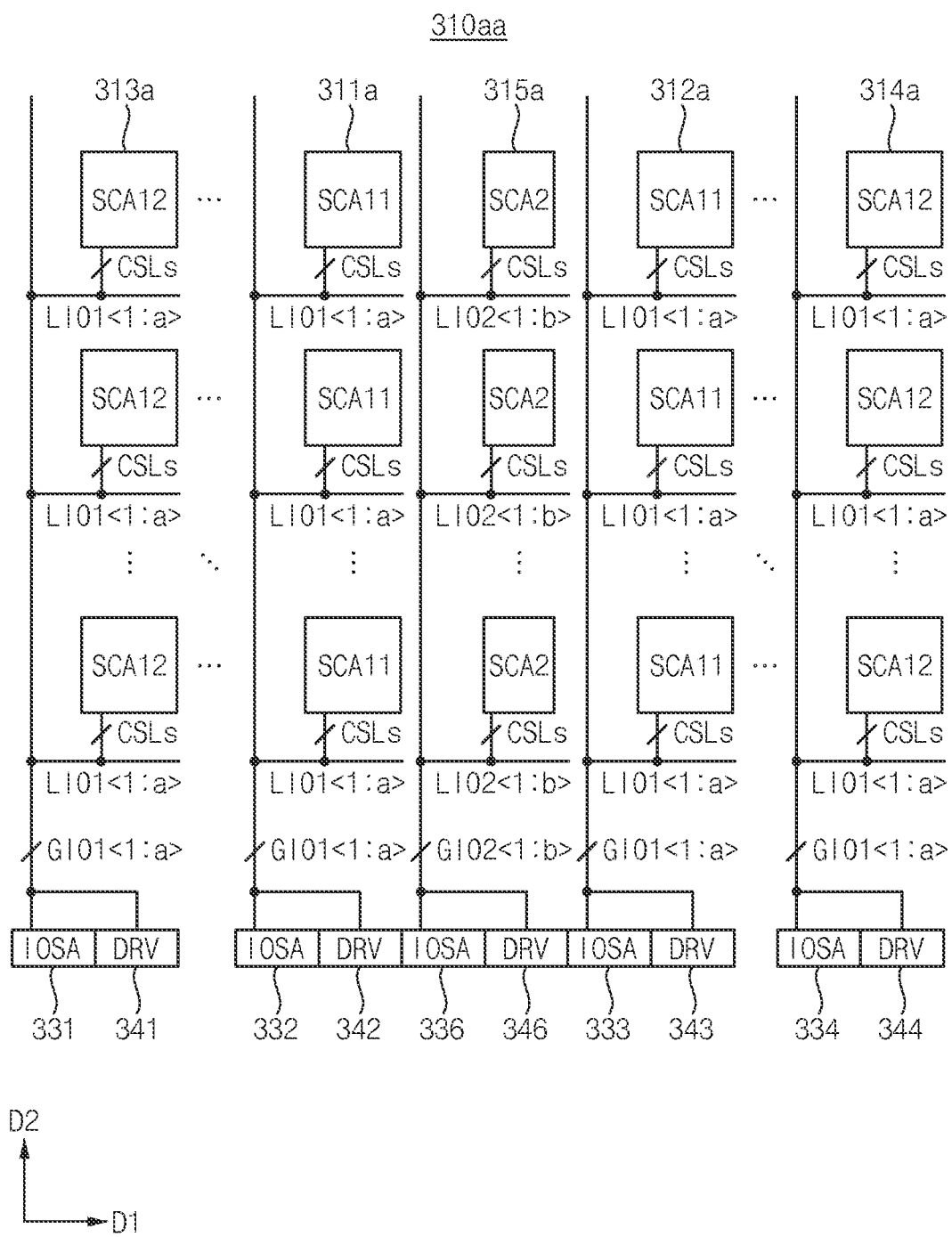
FIG. 21 is a block diagram illustrating an example of the first bank array in FIG. 3 according to example embodiments.

FIG. 21 is a block diagram illustrating an example of the first bank array in FIG. 3 according to example embodiments.

Referring to FIG. 21, a first bank array 310aa may include first sub array blocks SCA11 311a and 312a, second sub array blocks SCA12 313a and 314a, third sub array blocks SCA2 315a, I/O sense amplifiers 331, 332, 333, 334 and 336 and drivers 341, 342, 343, 344 and 346.

Data I/O for each of the first sub array blocks 311a and 312a and the second sub array blocks 313a and 314a may be performed through first global I/O lines GIO1<1:a>and first local I/O lines LIO1<1:a>. Here, "a" may be a natural number equal to or greater than 8. Depending on a read command or a write command, "a" bit-lines of each of the first sub array blocks 311a and 312a and the second sub array blocks 313a and 314a disposed in the second direction D2 may be selected by a column select signal transmitted through one of column select lines CSLs. The number of the first sub array blocks 311a and 312a and the second sub array blocks 313a and 314a may be different in other embodiments and, for example, may be determined depending on the number of bits of data the semiconductor memory device 200 is able to process.

Data I/O for the third sub array blocks 315a may be performed through second global I/O lines GIO2<1:b>and second local I/O lines LIO2<1:b>. Here, "b" may be a natural number smaller than "a". Depending on a read command or a write command, "b" bit-lines of the third sub array blocks 315a may be selected by a column select signal that is transmitted through one of the column select lines CSLs. The number of the third sub array blocks 315a may be different in other embodiments.

In example embodiments, the first bank array 310aa may further include first sub array blocks, second sub array blocks and third sub array blocks disposed in the first direction D1.

In example embodiments, the first sub array blocks 311a and 312a may store normal data and the count data, the second sub array blocks 313a and 314a may store the normal data and the third sub array blocks 315a may store the parity data and the count parity data. The normal data may be, for example, data that the semiconductor memory device 200 receives from an external device or data that the semiconductor memory device 200 will provide to the external device.

The I/O sense amplifier 331 may sense and amplify voltages of the first global I/O lines GIO1<1:a>, which are determined depending on bits output through the first global I/O lines GIO1<1:a>. Each of the I/O sense amplifiers 332, 333, 334 and 336 may operate in a manner similar to the I/O sense amplifier 331. The I/O sense amplifier 336 may sense and amplify voltages of the second global I/O lines GIO2<1:b>, which are determined depending on bits output through the second global I/O lines GIO2<1:b>.

The driver 341 may provide data to memory cells of the second sub array blocks 313a through the first global 110 lines GIO1<1:a>, the first local 110 lines LIO1<1:a>, and "a" bit-lines selected by a column select signal transmitted through one of column select lines CSLs based on a write command. The data may include bits received through one data I/O pin, or may include bits received through a plurality of data I/O pins, aligned at a rising edge or a falling edge of a data strobe signal.

The drivers 342, 343, 344 and 346 may operate in a manner substantially similar to the driver 341. The driver 346 may transmit the parity data or the count parity data to memory cells of the third sub array blocks 315a through the second global I/O lines GIO2<1:b>, the second local I/O lines LIO2<1:b>, and "b" bit-lines selected by a column select signal transmitted through one of column select lines CSLs.

FIGS. 22 through 24 illustrate example commands which may be used in the memory system of FIG. 1.

FIG. 22 illustrates combinations of a chip selection signal CS_n and first through fourteenth command-address signals CA0~CA13 representing an active command ACT, a write command WR and a read command RD, FIG. 23 illustrates combinations of the chip selection signal CS_n and the first through fourteenth command-address signals CA0~CA13 representing a write command WRA including an auto precharge and a read command RDA including an auto precharge, and FIG. 24 illustrates combinations of the chip selection signal CS_n and the first through fourteenth command-address signals CA0~CA13 representing precharge commands PREab, PREsb and PREpb.

In FIGS. 22 through 24, H indicates a logic high level, L indicates a logic low level, V indicates a valid logic level corresponding to one of the logic high level H or the logic low level L, R0~R17 indicate bits of a row address, BA0 through BA1 indicate bits of a bank address, BG0 through BG2 indicate bits of a bank group address, and CID0 through CID3 indicate die identifier of a memory die (or a memory chip) when the semiconductor memory device 200 is implemented with a stacked memory device including a plurality of memory dies. In addition, in FIGS. 22 and 23, C2~C10 indicate bits of a column address, in FIG. 22, BL indicates burst length flag and in FIG. 23, AP indicates auto precharge flag.

Referring to FIG. 22, the active command ACT, the write command WR and the read command RD may be transferred during two cycles, for example, during the logic high level H and the logic low level L of the chip selection signal CS_n. The active command ACT may include the bank address bits BA0 and BA1 and the row address bits R0~R17.

Referring to FIG. 23, the write command WRA including an auto precharge and the read command RDA including an auto precharge may be transferred during two cycles, for example, during the logic high level H and the logic low level L of the chip selection signal CS_n, and may include the bank address bits BA0 and BA1 and the column address bits C3~C10 or C2~C10. Either the tenth command-address signal CA9 or the eleventh command-address signal CA10 of the write command WRA including an auto precharge and the read command RDA including an auto precharge may be used as an active count update flag.

In FIG. 24, PREpb is a precharge command to precharge a particular bank in a particular bank group, PREab is an all bank precharge command to precharge all banks in all bank groups and PREsb is a same bank precharge command to precharge the same bank in all bank groups.

Referring to FIG. 24, the ninth command-address signal CA8 or the tenth command-address signal CA9 of each of the precharge commands PREab and PREsb may be uses as an active count update flag designating the internal read-update-write operation.

Figure 25:
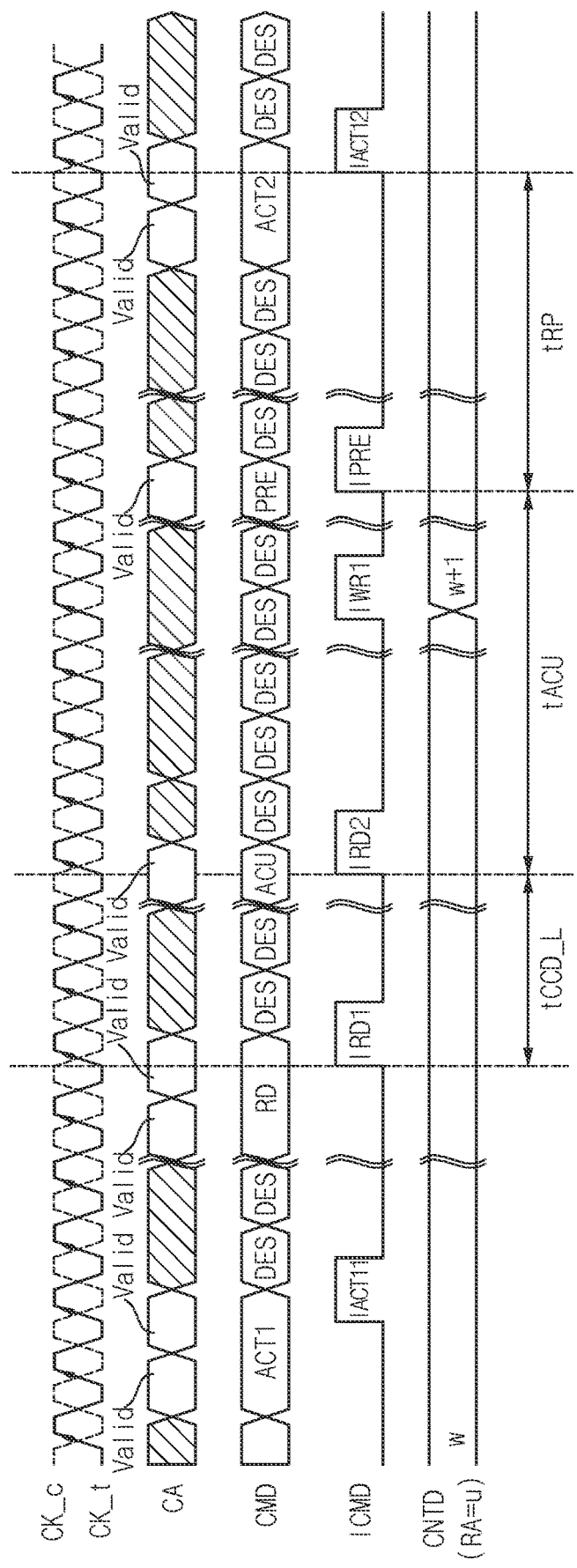
FIGS. 25 and 26 illustrate examples of command protocols of the memory system when the memory system uses the active count update command, respectively.
Figure 26:
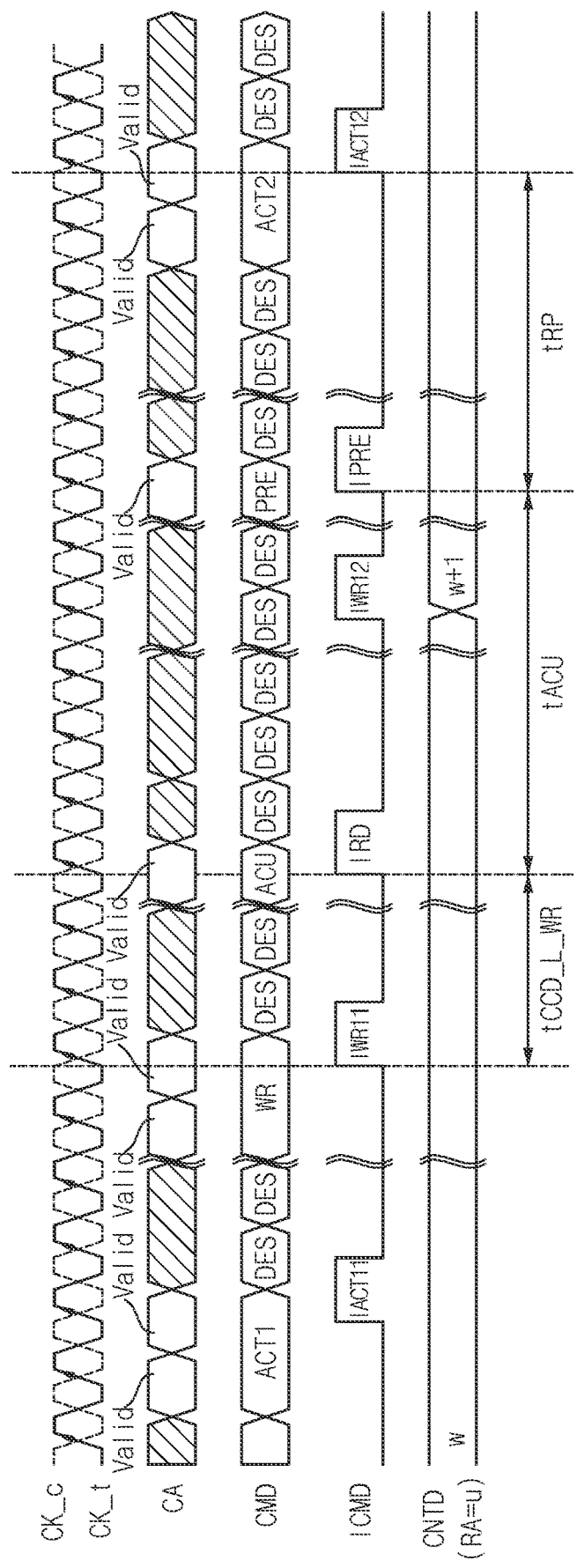

FIGS. 25 and 26 illustrate examples of command protocols of the memory system when the memory system uses the active count update command, respectively.

In FIGS. 25 and 26, differential clock signal pair CK_t and CK_c are illustrated.

Referring to FIGS. 1, 2, 3 and 25, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT11.

After applying the first active command ACT1, the scheduler 55 applies a read command RD designating a read operation on the first target memory cell row to the semiconductor memory device 200 in synchronization with an edge of the clock signal CK_t. The control logic circuit 210, in response to the read command RD, performs a read operation on data stored in the first target memory cell row by enabling a first read signal IRD1.

After a time interval corresponding to a delay time of consecutive read commands to the same bank group tCCD_L from applying the read command RD, the scheduler 55 applies an active count update command ACU to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a second read signal IRD2 and a write signal IWR1 in response to the active count update command ACU. Therefore, bit values stored in the first target memory cell row designated by the first target row address (e.g., RA=u) is increased by one from w to w+1.

After a time interval corresponding to a time tACU of performing the internal read-update-write operation from applying the active count update command ACU, the scheduler applies a precharge command PRE to the semiconductor memory device 200 and the control logic circuit 210, in response to the precharge command PRE, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT12.

Referring to FIGS. 1, 2, 3 and 26, the scheduler 55 applies a first active command ACT1 which is accompanied by a first target row address designating a first target memory cell row to the semiconductor memory device 200 in synchronization with an edge of the clock signal CK_t.

The control logic circuit 210, in response to the first active command ACT1, enables the first target word-line connected to the first target memory cell row by enabling a first active signal IACT11.

After applying the first active command ACT1, the scheduler 55 applies a write command WR designating a write operation on the first target memory cell row to the semiconductor memory device 200 in synchronization with an edge of the clock signal CK_t. The control logic circuit 210, in response to the write command WR, performs a write operation to store data in the first target memory cell row by enabling a first write signal IWR11.

After a time interval corresponding to a delay time of consecutive write commands to the same bank group tCCD_L_WR from applying the write command WR, the scheduler 55 applies an active count update command ACU to the semiconductor memory device 200 in synchronization with an edge of the clock signal CK_t and the control logic circuit 210 reads the count data CNTD from the first target memory cell row, updates the read count data CNTD and stores the updated count data in the first target memory cell row by sequentially enabling a read signal IRD and a second write signal IWR12 in response to the active count update command ACU. Therefore, bit values stored in the first target memory cell row designated by the first target row address (e.g., RA=u) is increased by one from w to w+1.

After a time interval corresponding to a time tACU of performing the internal read-update-write operation from applying the active count update command ACU, the scheduler 55 applies a precharge command PRE to the semiconductor memory device 200 and the control logic circuit 210, in response to the precharge command PRE, precharges the first target word-line by enabling a precharge signal IPRE.

After a time interval corresponding to precharge time tRP, the scheduler 55 applies a second active command ACT2 associated with a second target memory cell row to the semiconductor memory device 200 and the control logic circuit 210, in response to the second active command ACT2, enables a second target word-line connected to the second target memory cell row by enabling a second active signal IACT12.

Figure 27:
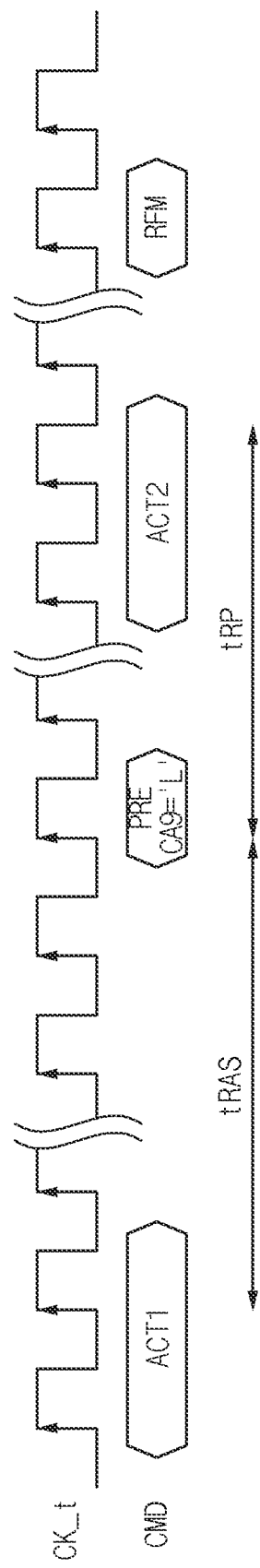
FIG. 27 illustrates an example of the command protocol of the memory system when the memory system updates the count data based on the precharge command.

FIG. 27 illustrates an example of the command protocol of the memory system when the memory system updates the count data based on the precharge command.

Referring to FIGS. 1, 2, 24 and 27, the scheduler 55 applies the first active command ACT1 to the semiconductor memory device 200 in synchronization with an edge of the clock signal CK_t, and applies the precharge command PRE designating an internal read-update-write operation on the count data stored in a target memory cell designated by a target row address accompanied by the first active command ACT1 to the semiconductor memory device 200 after a tRAS corresponding to active to precharge time elapses. In this case, the scheduler 55 may set the tenth command-address signal CA9 of the precharge command PRE to a logic low level L.

After a time interval corresponding to precharge time tRP, the scheduler 55 applies a second active command ACT2 to the semiconductor memory device 200 in synchronization with an edge of the clock signal CK_t and applies a refresh management command RFM to the semiconductor memory device 200. The semiconductor memory device 200 performs a hammer refresh operation on one or more victim memory cell rows physically adjacent to a memory cell row corresponding to the hammer address, in response to the refresh management command RFM.

Figure 28:
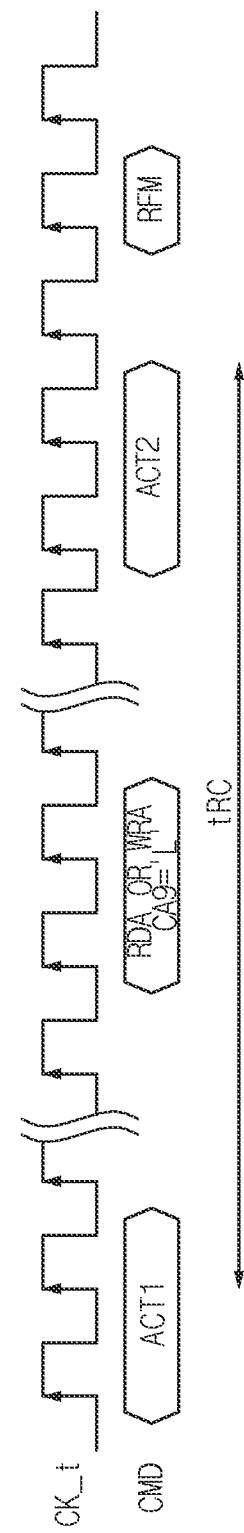
FIG. 28 illustrates an example of the command protocol of the memory system when the memory system updates the count data based on the read command including an auto precharge or the write command including an auto precharge.

FIG. 28 illustrates an example of the command protocol of the memory system when the memory system updates the count data based on the read command including an auto precharge or the write command including an auto precharge.

Referring to FIGS. 1, 2, 23 and 28, the scheduler 55 applies the first active command ACT1 to the semiconductor memory device 200 in synchronization with an edge of the clock signal CK_t, and applies the read command RDA including an auto precharge or the write command WRA including an auto precharge designating an internal read-update-write operation on the count data stored in a target memory cell designated by a target row address accompanied by the first active command ACT1 to the semiconductor memory device 200. In this case, the scheduler 55 may set the tenth command-address signal CA9 of the read command RDA including an auto precharge or the write command WRA including an auto precharge to a logic low level L. The row hammer management circuit 500 may perform the internal read-update-write operation in response to the logic low level L of the tenth command-address signal CA9.

After a time interval corresponding to active time tRC from applying the first active command ACT1, the scheduler 55 applies a second active command ACT2 to the semiconductor memory device 200 and applies a refresh management command RFM to the semiconductor memory device 200. The semiconductor memory device 200 performs a hammer refresh operation on one or more victim memory cell rows physically adjacent to a memory cell row corresponding to the hammer address, in response to the refresh management command RFM.

In FIG. 28, the scheduler 55 may selectively apply the read command RDA including an auto precharge or the write command WRA including an auto precharge to the semiconductor memory device 200.

Figure 29:
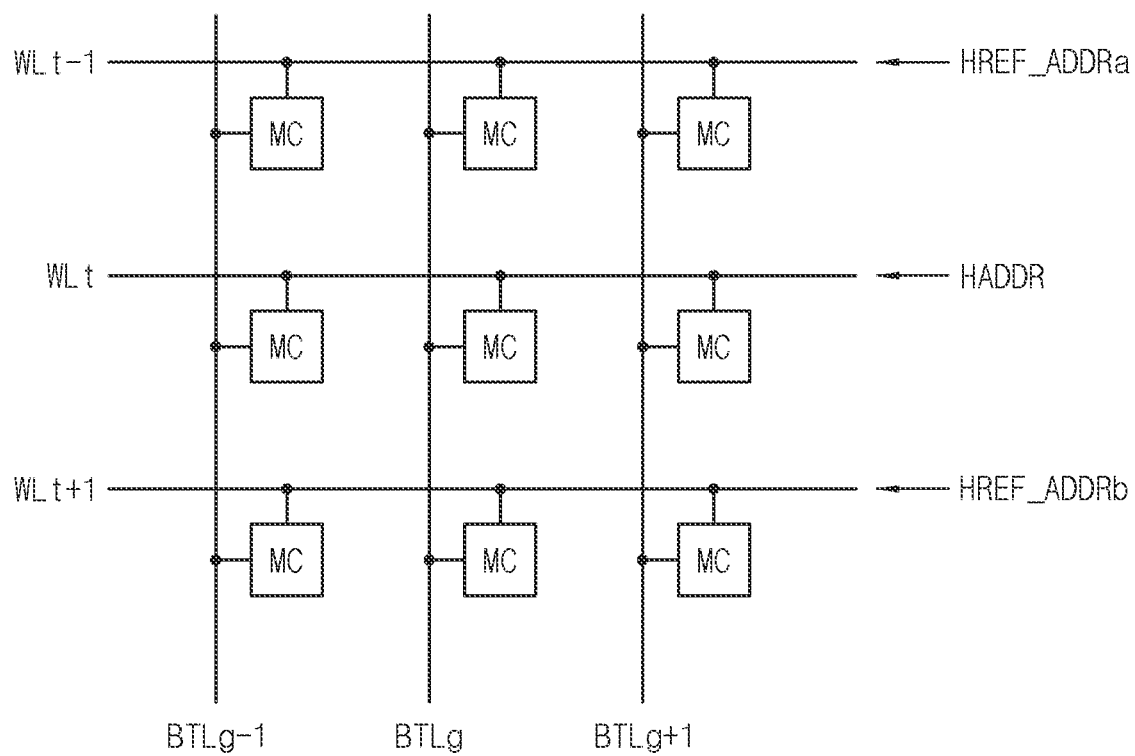
FIG. 29 is a diagram illustrating a portion of a memory cell array for describing generation of hammer refresh addresses.

FIG. 29 is a diagram illustrating a portion of a memory cell array for describing generation of hammer refresh addresses.

FIG. 29 illustrates three word-lines WLt−1, WLt and WLt+1, three bit-lines BTLg−1, BTLg and BTLg+1 and memory cells MC coupled to the word-lines WLt−1, WLt and WLt+1 and the bit-lines BTLg−1, BTLg and BTLg+1 in the memory cell array. The three word-lines WLt−1, WLt and WLt+1 are extended in the first direction D1 and arranged sequentially along the second direction D2. The three bit-lines BTLg−1, BTLg and BTLg+1 are extended in the second direction D2 and arranged sequentially along the first direction D1. It will be understood that the word-lines WLt−1 and WLt are physically directly adjacent to each other since there are no intervening word-lines between the word-lines WLt−1 and WLt. The word-lines WLt−1 and WLt+1 may be physically adjacent to each other, but may not be physically directly adjacent to each other since WLt is an intervening word-line.

For example, the middle word-line WLt may correspond to the hammer address HADDR that has been intensively accessed. It will be understood that "an intensively accessed word-line" refers to a word-line that has a relatively higher activation number and/or has a relatively higher activation frequency compared to other word-lines. Whenever the hammer word-line (e.g., the middle word-line WLt) is accessed, the hammer word-line WLt is enabled and precharged, and the voltage level of the hammer word-line WLt is increased and decreased. Word-line coupling may cause the voltage levels of the adjacent word-lines WLt−1 and WLt+1 to fluctuate as the voltage level of the hammer word-line WLt varies, and thus the cell charges of the memory cells MC coupled to the adjacent word-lines WLt−1 and WLt+1 may be affected. As the hammer word-line WLt is accessed more frequently, the cell charges of the memory cells MC coupled to the adjacent word-lines WLt−1 and WLt+1 may be lost more rapidly.

The hammer refresh address generator 440 in FIG. 5 may provide the hammer refresh address HREF_ADDR representing the addresses HREF_ADDRa and HREF_ADDRb of the rows (e.g., the word-lines WLt−1 and WLt+1) that are physically adjacent to the row of the hammer address HADDR (e.g., the hammer word-line WLt), and a refresh operation for the adjacent word-lines WLt−1 and WLt+1 may be performed additionally based on (e.g., in response to) the hammer refresh address HREF_ADDR to reduce or possibly prevent the loss of data stored in the memory cells MC.

Figure 30:
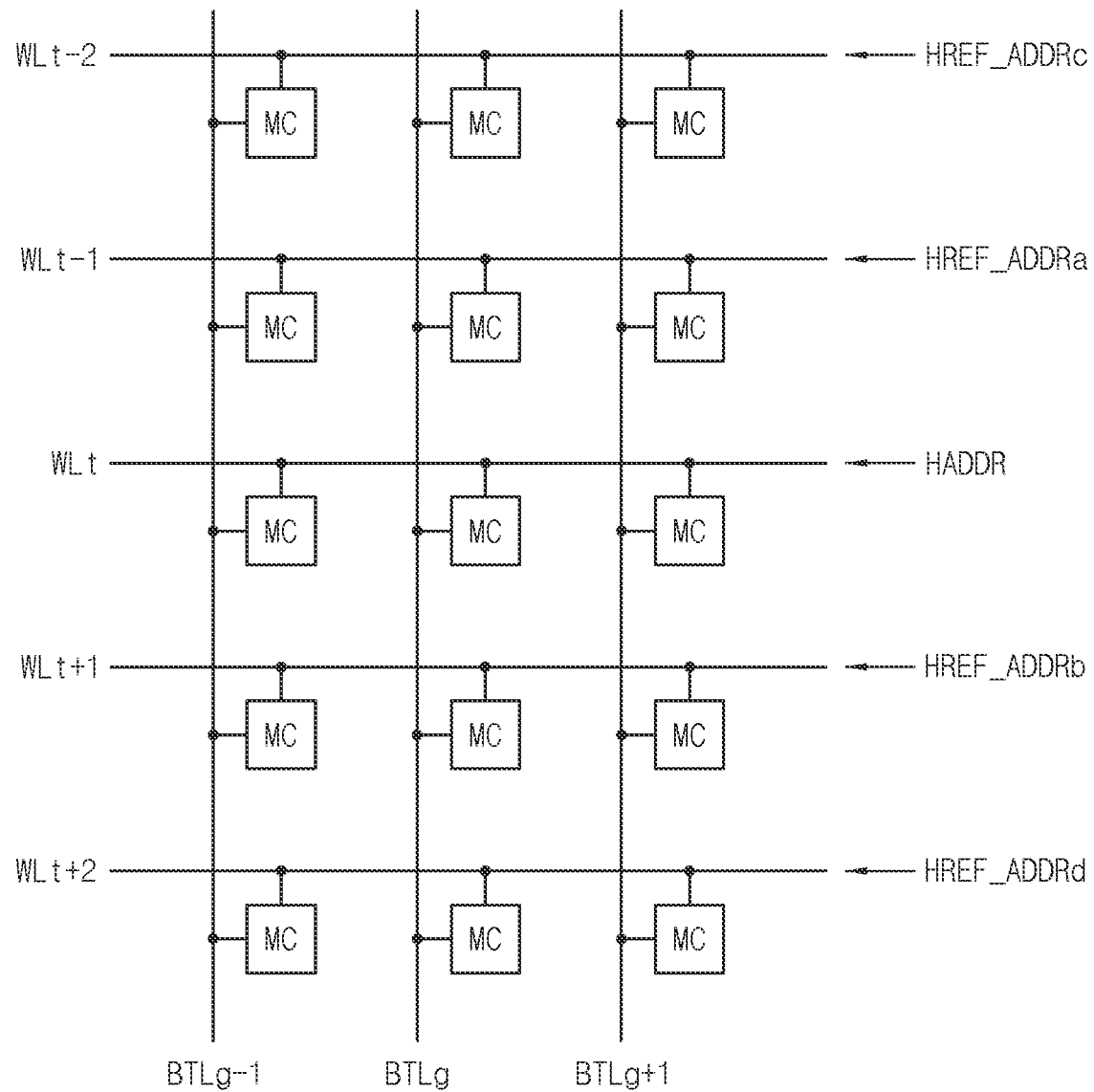
FIG. 30 is a diagram illustrating a portion of a memory cell array for describing generation of hammer refresh addresses in response to the second type of hammer address.

FIG. 30 is a diagram illustrating a portion of a memory cell array for describing generation of hammer refresh addresses in response to the second type of hammer address.

FIG. 30 illustrates five word-lines WLt−2, WLt−1, WLt, WLt+1 and WLt+2, three bit-lines BTLg−1, BTLg and BTLg+1 and memory cells MC coupled to the word-lines WLt−2, WLt−1, WLt, WLt+1 and WLt+2 and the bit-lines BTLg−1, BTLg and BTLg+1 in the memory cell array. The five word-lines WLt−2, WLt−1, WLt, WLt+1 and WLt+2 are extended in the first direction D1 and arranged sequentially along the second direction D2.

The hammer refresh address generator 440 in FIG. 5 may provide the hammer refresh address HREF_ADDR representing addresses HREF_ADDRa, HREF_ADDRb, HREF_ADDRc and HREF_ADDRd of the rows (e.g., the word-lines WLt−1, WLt+1, WLt−2 and WLt+2) that are physically adjacent to the row of the hammer address HADDR (e.g., the middle word-line WLt), and a refresh operation for the adjacent word-lines WLt−1, WLt+1, WLt−2 and WLt+2 may be performed additionally based on (e.g., in response to) the hammer refresh address HREF_ADDR to reduce or possibly prevent the loss of data stored in the memory cells MC.

Figure 31A:
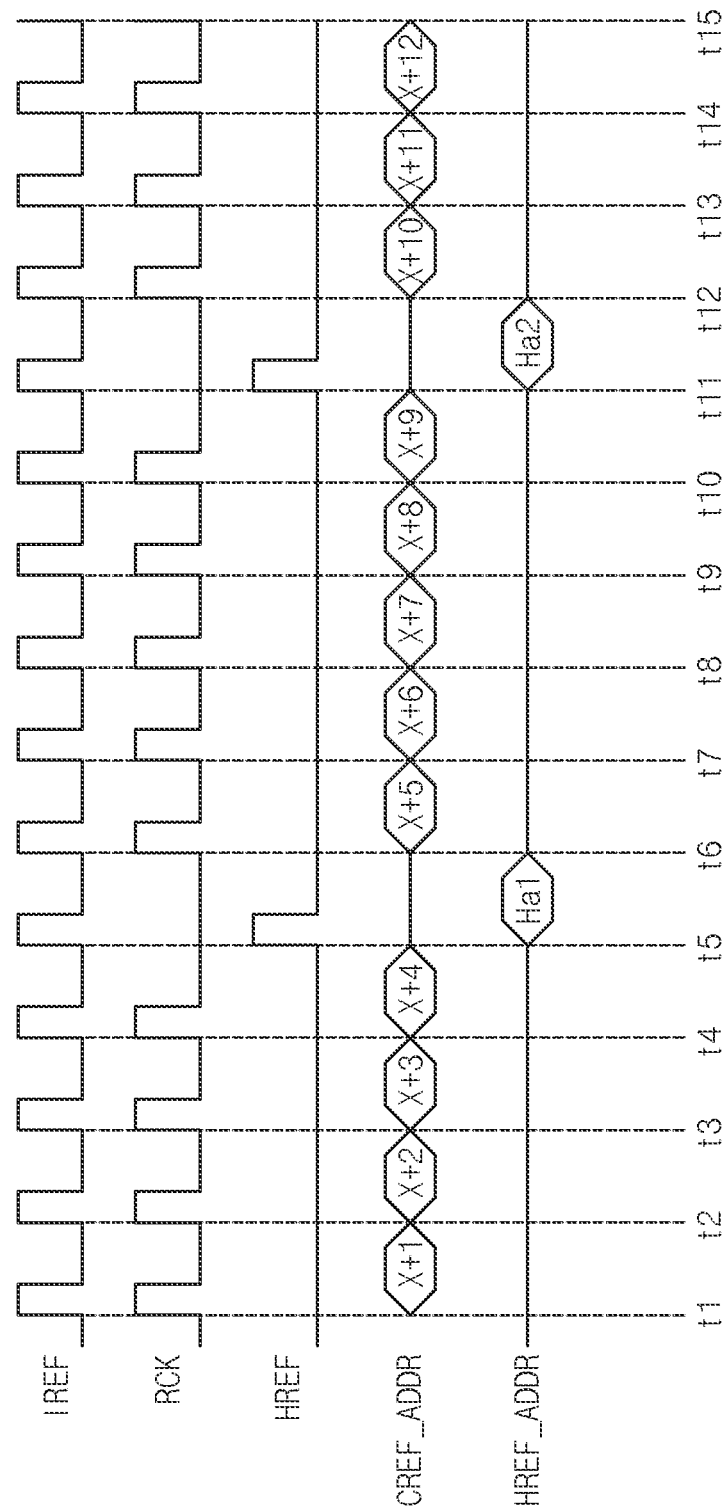
FIGS. 31A, 31B and 32 are timing diagrams illustrating example operations of a refresh control circuit of FIG. 5 according to example embodiments.
Figure 31B:
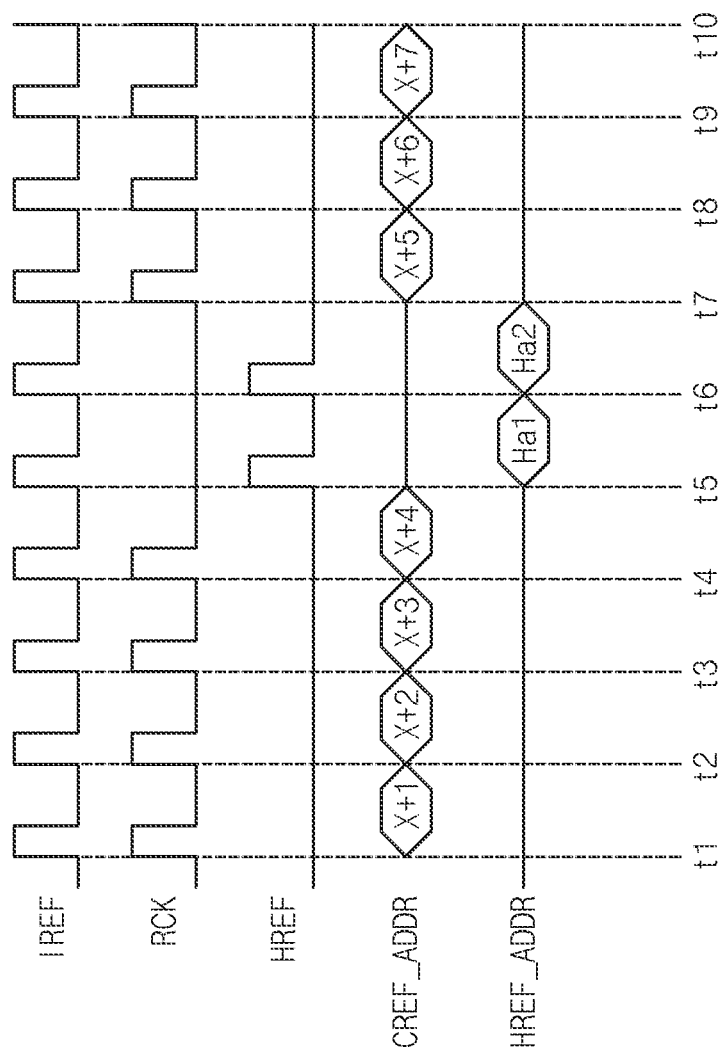
Figure 32:
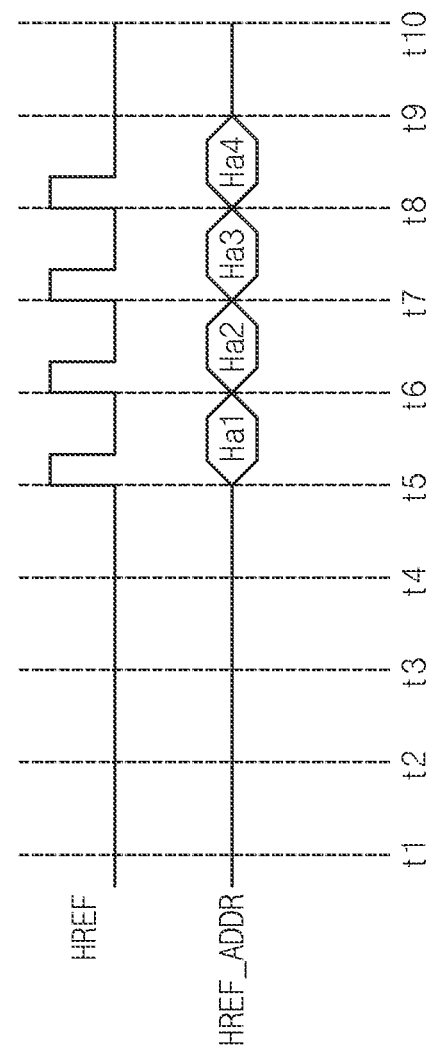

FIGS. 31A, 31B and 32 are timing diagrams illustrating example operations of a refresh control circuit of FIG. 5 according to example embodiments.

FIGS. 31A and 31B illustrate generations of a refresh clock signal RCK, a hammer refresh signal HREF, a counter refresh address CREF_ADDR, and a hammer refresh address HREF_ADDR, with respect to a refresh control signal IREF that is activated in a pulse shape at activation time points t1~t15 or at activation time points t1~t10. The intervals between the activation time points t1~t15 or the activation time points t1~t10 of the refresh control signal IREF may be regular or irregular.

Referring to FIGS. 5 and 31A, the refresh control logic 410 may activate the refresh clock signal RCK in synchronization with some time points t1~t4, t6~t10 and t12~t15 among the activation time points t1~t15 of the refresh control signal IREF, and may activate the hammer refresh signal HREF with the other time points t5 and t11.

The refresh counter 430 may generate the counter refresh address CREF_ADDR representing the sequentially changing addresses X+1~X+12 in synchronization with the activation time points t1~t4, t6~t10 and t12~t14 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t11 of the hammer refresh signal HREF.

Referring to FIGS. 5 and 31B, the refresh control logic 410 may activate the refresh clock signal RCK in synchronization with some time points t1~t4 and t7~t10 among the activation time points t1~t10 of the refresh control signal IREF, and may activate the hammer refresh signal HREF with the other time points t5 and t6.

The refresh counter 430 may generate the counter refresh address CREF_ADDR representing the sequentially changing addresses X+1~X+7 in synchronization with the activation time points t1~t4 and t7~t9 of the refresh clock signal RCK. The hammer refresh address generator 440 may generate the hammer refresh address HREF_ADDR representing the address Ha1 and Ha2 of the rows that are physically adjacent to the row of the hammer address in synchronization with the activation time points t5 and t6 of the hammer refresh signal HREF.

Referring to FIGS. 5 and 32, the hammer refresh address generator 440 may generate the hammer refresh address HREF_ADDR representing the address Ha1, Ha2, Ha3 and Ha4 of the rows that are physically adjacent to the row of the hammer address in synchronization with the activation time points t5, t6, t7, t8 of the hammer refresh signal HREF.

Figure 33:
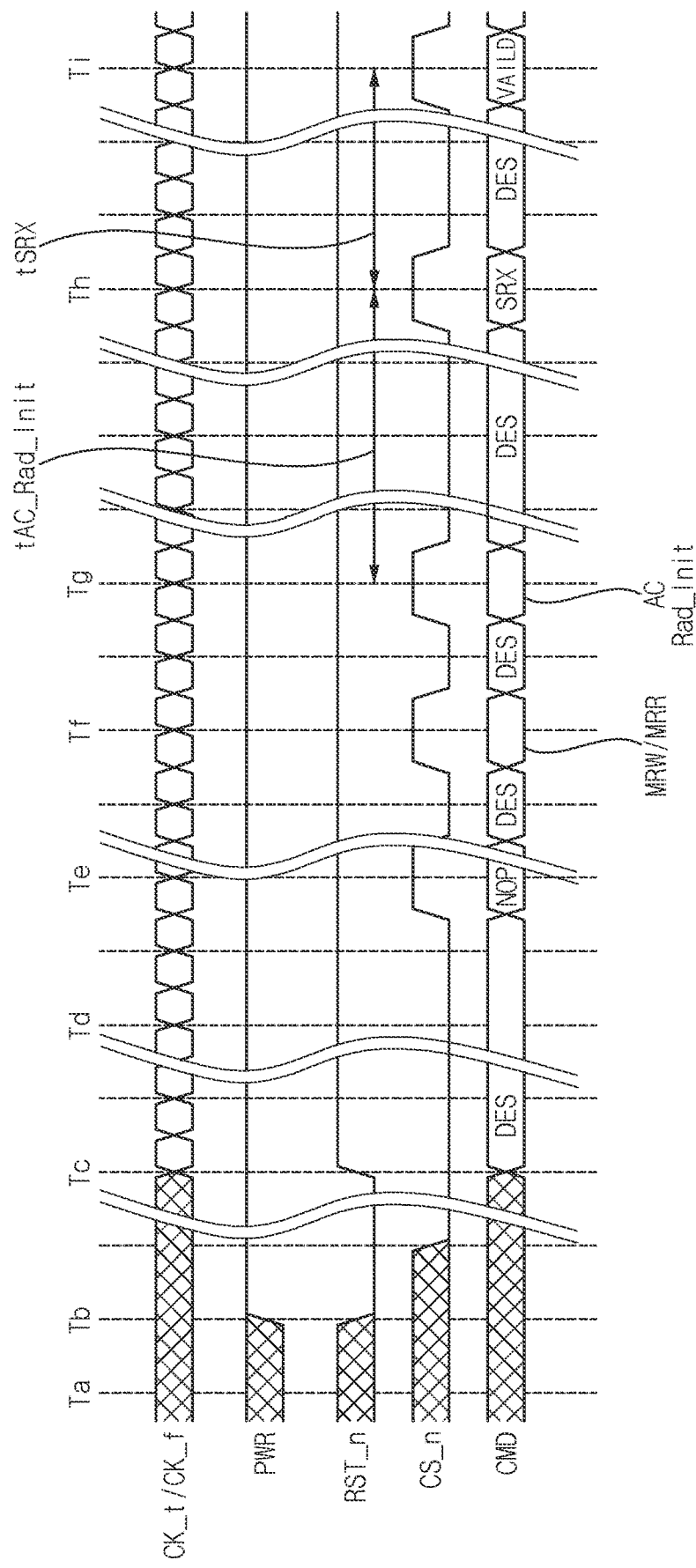
FIG. 33 illustrates an example of a command protocol of the memory system when the memory system uses a random initialization command.

FIG. 33 illustrates an example of a command protocol of the memory system when the memory system uses a random initialization command.

In FIG. 33, differential clock signal pair CK_t and CK_c and time points Ta, Tb, Tc, Td, Te, Tf, Tg, Th and Ti based on the differential clock signal pair CK_t and CK_c are illustrated.

Referring to FIGS. 1, 2, 3 and 33, the differential clock signal pair CK_t and CK_f and the command CMD are applied to the semiconductor memory device 200 from a time point Tc, a power PWR and a reset signal RST_n are applied to the semiconductor memory device 200 from a time point Tb, and a chip selection signal CS_n is applied to the semiconductor memory device 200 between the time points Tb and Tc.

At a time point Tf, the memory controller 30 applies a mode register write command MRW and a mode register read command MRR to the semiconductor memory device 200, at a time point Tg, the row hammer management circuit 500 in the semiconductor memory device 200 writes random count data in count cells in each of the memory cell rows in response to active count random initialization command AC Rad_Init from the memory controller 30 and the semiconductor memory device 200 enters into a self-refresh mode to maintain the random count data.

At a time point Th after a time interval corresponding to tAC_Rad_Init elapses from the time point Tg, the memory controller 30 applies a self-refresh exit command SRX to the semiconductor memory device 200 and the semiconductor memory device 200 exits from the self-refresh mode during a time interval tSRX between the time points Th and Ti and enters into a normal mode.

Figure 34:
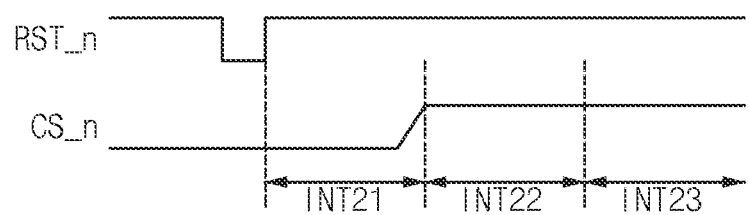
FIG. 34 is a timing diagram illustrating an example of the power-up sequence according to example embodiments.

FIG. 34 is a timing diagram illustrating an example of the power-up sequence according to example embodiments.

Referring to FIG. 34, the power-up sequence may include a first time interval INT21, a second time interval INT22 and a third time interval INT23.

The first time interval INT21 may correspond to a time interval between a time point at which the semiconductor memory device 200 receives a reset signal RST_n and a time point at which the semiconductor memory device 200 receives a chip selection signal CS_n, the second time interval INT22 may correspond to a time interval between the time point at which the semiconductor memory device 200 receives the chip selection signal CS_n and the semiconductor memory device 200 is capable of receiving a command, and the third time interval INT23 may correspond to a time interval during which the semiconductor memory device 200 receives actual commands.

During the first time interval INT21, the row hammer management circuit 500 in the semiconductor memory device 200 may automatically generate random count data and store the random count data in count cells of each of the plurality of memory cell rows without receiving a command from the memory controller 30.

During the second time interval INT22, the semiconductor memory device 200 may perform training with the memory controller 30 and the semiconductor memory device 200 may perform a normal operation based on a command received from the memory controller 30 when the third time interval INT23 begins.

If the row hammer management circuit 500 does not automatically generate the random count data and does not store the random count data in the count cells of each of the plurality of memory cell rows during the first time interval INT21, a malicious hacker may generate repeated accesses on memory cell rows to cause an overflow in the hammer address queue in the row hammer management circuit 500 when the third time interval INT23 begins. However, because the row hammer management circuit 500 in the semiconductor memory device 200 according to example embodiments automatically generates the random count data and stores the random count data in count cells of each of the plurality of memory cell rows without receiving a command from the memory controller 30 during the first time interval INT21, the row hammer management circuit 500 may prevent overflow occurring in the hammer address queue although repeated accesses on memory cell rows are generated.

Figure 35:
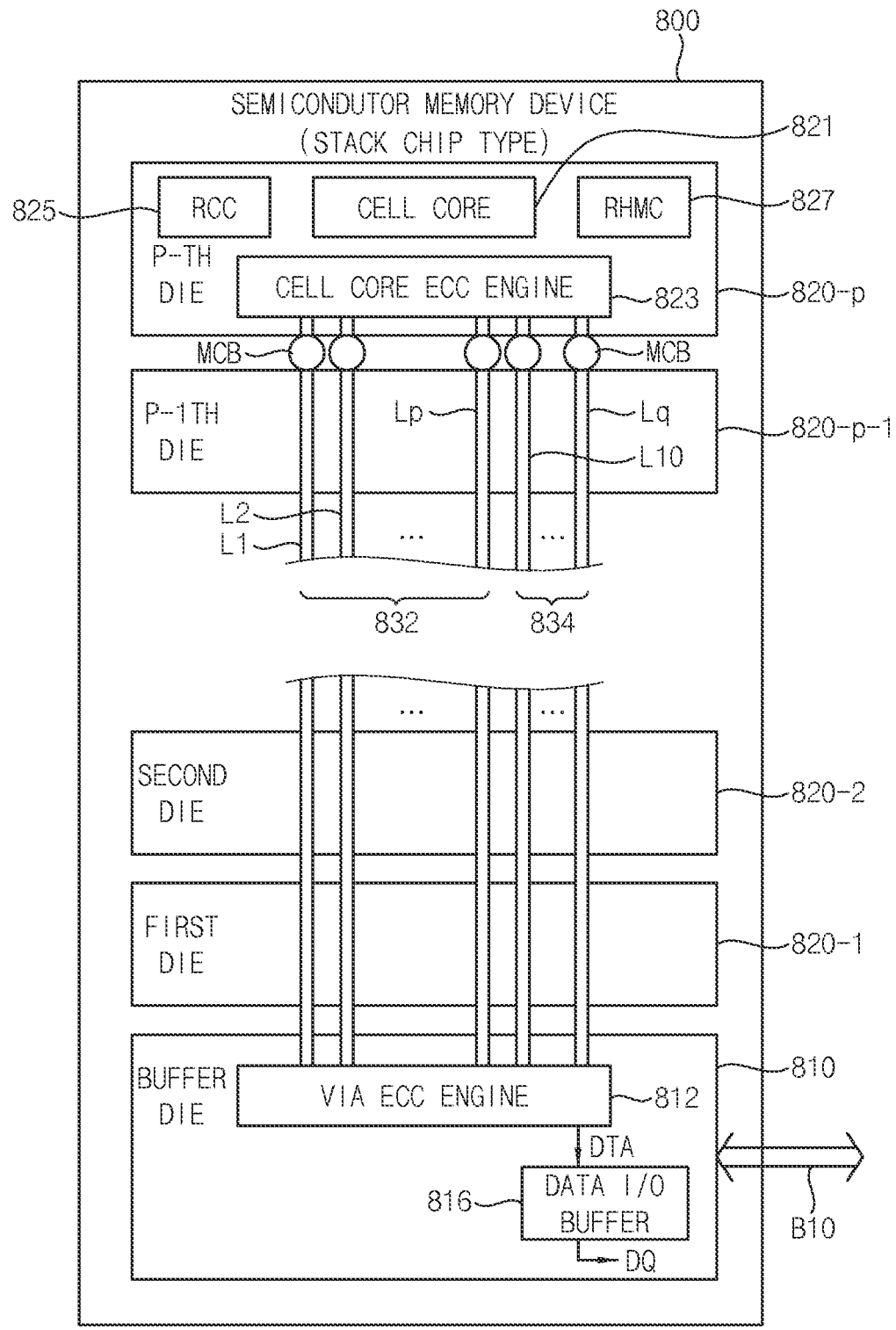
FIG. 35 is a block diagram illustrating a semiconductor memory device according to example embodiments.

FIG. 35 is a block diagram illustrating a semiconductor memory device according to example embodiments.

Referring to FIG. 35, a semiconductor memory device 800 may include at least one buffer die 810 and a plurality of memory dies 820-1 to 820-*p* (p is a natural number equal to or greater than three) providing a soft error analyzing and correcting function in a stacked chip structure.

The plurality of memory dies 820-1 to 820-*p* are stacked on the buffer die 810 and convey data through a plurality of through silicon via (TSV) lines.

Each of the plurality of memory dies 820-1 to 820-*p* may include a cell core 821 to store data, a cell core ECC engine 823 which generates transmission parity bits (i.e., transmission parity data) based on transmission data to be sent to the at least one buffer die 810, a refresh control circuit (RCC)

825 and a row hammer management circuit (RHMC) 827. The cell core 821 may include a plurality of memory cells having DRAM cell structure.

The refresh control circuit 825 may employ the refresh control circuit 400 of FIG. and the row hammer management circuit 827 may employ the row hammer management circuit 500 of FIG. 8. The row hammer management circuit 827 may automatically store random count data in count cell in each of a plurality of memory cell rows, may store active count of each of the plurality of memory cell rows in the count cells in each of the plurality of memory cell rows as a count data, may update the count data based on a subsequent command which is applied after the active command, and thus may manage row hammer of all of the memory cell rows. The row hammer management circuit 827 may include a hammer address queue. The hammer address queue may transit a logic level of an alert signal provided to a memory controller from a first logic level to a second logic level in response to candidate hammer addresses being stored in all of FIFO registers in the hammer address queue, and may output one of the candidate hammer addresses as a hammer address. The refresh control circuit 825 may receive the hammer address from the row hammer management circuit 827 and may perform a hammer refresh operation on one or more victim memory cell rows physically adjacent to a memory cell row corresponding to the hammer address.

The buffer die 810 may include a via ECC engine 812 which corrects a transmission error using the transmission parity bits when a transmission error is detected from the transmission data received through the TSV lines and generates error-corrected data.

The buffer die 810 may further include a data I/O buffer 816. The data I/O buffer 816 may generate the data signal DQ by sampling the data DTA from the via ECC engine 812 and may output the data signal DQ to an outside (e.g., to an external source).

The semiconductor memory device 800 may be a stack chip type memory device or a stacked memory device which conveys data and control signals through the TSV lines. The TSV lines may be also called 'through electrodes'.

The cell core ECC engine 823 may perform error correction on data which is outputted from the memory die 820-$p$ before the transmission data is sent.

A data TSV line group 832 which is formed at one memory die 820-$p$ may include TSV lines L1, L2, . . . , Lp, and a parity TSV line group 834 may include TSV lines L10 to Lq. The TSV lines L1, L2, . . . , Lp of the data TSV line group 832 and the parity TSV lines L10 to Lq of the parity TSV line group 834 may be connected to micro bumps MCB which are correspondingly formed among the memory dies 820-1 to 820-$p$.

The semiconductor memory device 800 may have a three-dimensional (3D) chip structure or a 2.5D chip structure to communicate with the host through a data bus B10. The buffer die 810 may be connected with the memory controller through the data bus B10.

According to example embodiments, as illustrated in FIG. 35, the cell core ECC engine 823 may be included in the memory die, and the via ECC engine 812 may be included in the buffer die. Accordingly, it may be possible to detect and correct soft data fail. The soft data fail may include a transmission error which is generated due to noise when data is transmitted through TSV lines.

Figure 36:
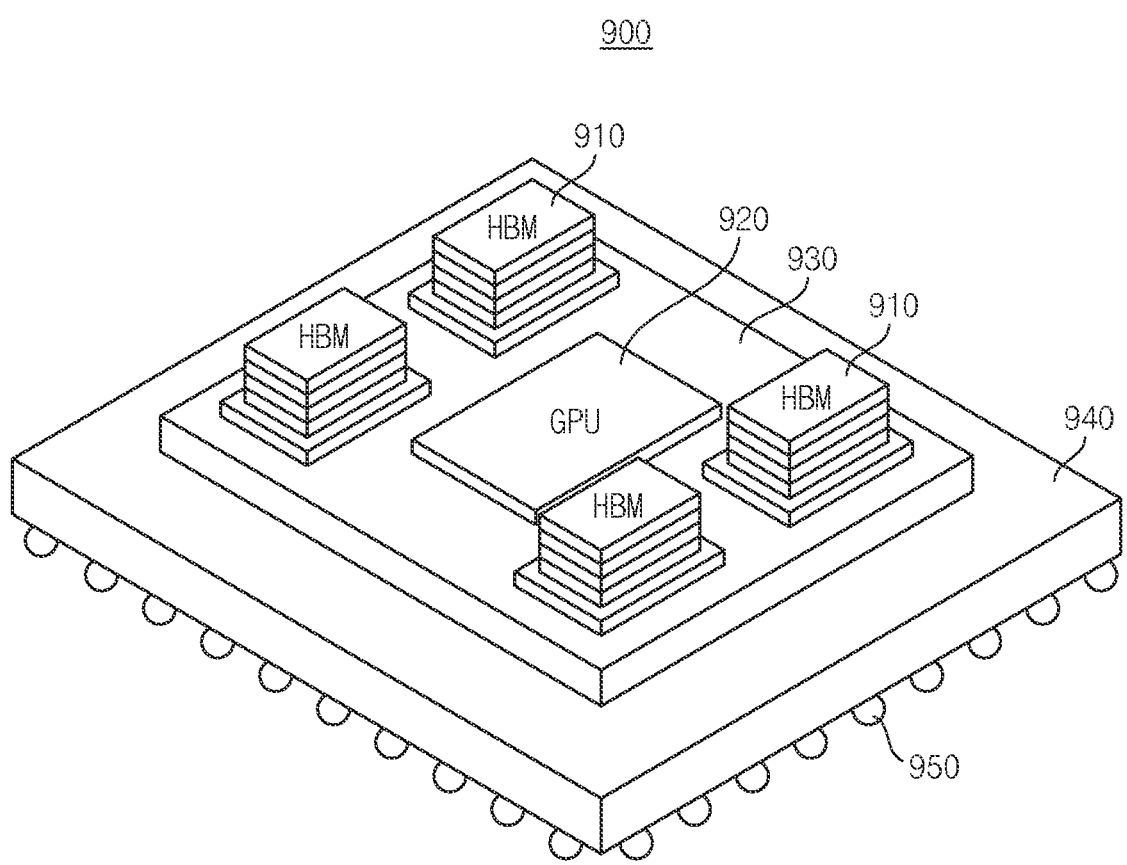
FIG. 36 is a configuration diagram illustrating a semiconductor package including the stacked memory device according to example embodiments.

FIG. 36 is a configuration diagram illustrating a semiconductor package including the stacked memory device according to example embodiments.

Referring to FIG. 36, a semiconductor package 900 may include one or more stacked memory devices 910 and a graphic processing unit (GPU) 920.

The stacked memory devices 910 and the GPU 920 may be mounted on an interposer 930, and the interposer on which the stacked memory device 910 and the GPU 920 are mounted may be mounted on a package substrate 940 mounted on solder balls 950. The GPU 920 may correspond to a semiconductor device which may perform a memory control function, and for example, the GPU 920 may be implemented as an application processor (AP). The GPU 920 may include a memory controller having a scheduler.

The stacked memory device 910 may be implemented in various forms, and the stacked memory device 910 may be a memory device in a high bandwidth memory (HBM) form in which a plurality of layers are stacked. Accordingly, the stacked memory device 910 may include a buffer die and a plurality of memory dies and each of the plurality of memory dies may include a refresh control circuit and a row hammer management circuit.

The plurality of stacked memory devices 910 may be mounted on the interposer 930, and the GPU 920 may communicate with the plurality of stacked memory devices 910. For example, each of the stacked memory devices 910 and the GPU 920 may include a physical region, and communication may be performed between the stacked memory devices 910 and the GPU 920 through the physical regions. Meanwhile, when the stacked memory device 910 includes a direct access region, a test signal may be provided into the stacked memory device 910 through conductive means (e.g., solder balls 950) mounted under the package substrate 940 and the direct access region.

Figure 37:
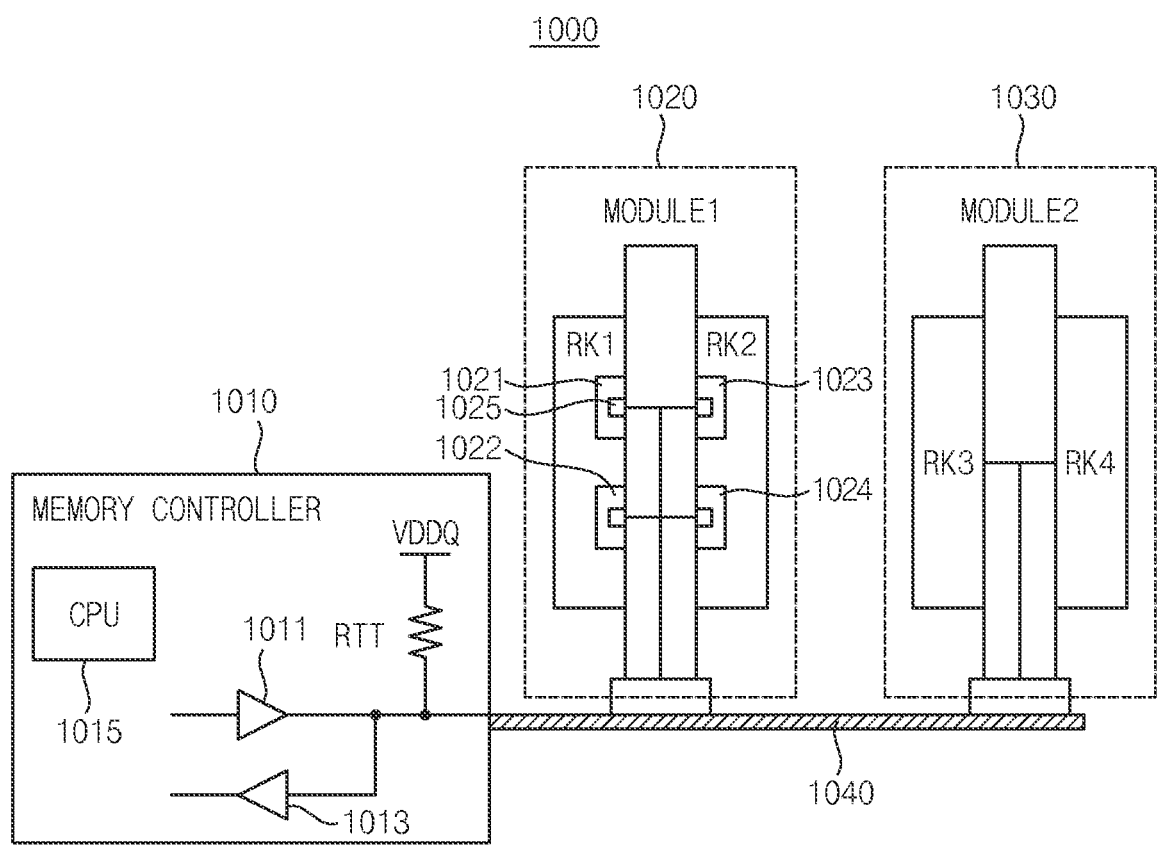
FIG. 37 is a block diagram illustrating a memory system having quad-rank memory modules according to example embodiments.

FIG. 37 is a block diagram illustrating a memory system having quad-rank memory modules according to example embodiments.

Referring to FIG. 37, a memory system 1000 may include a memory controller 1010 and/or memory modules 1020 and 1030. While two memory modules are depicted in FIG. 37, more or fewer memory modules may be included in the memory system 1000, according to some example embodiments.

The memory controller 1010 may control a memory module 1020 and/or 1030 so as to perform a command supplied from a processor and/or a host. The memory controller 1010 may be implemented using processing circuitry (e.g., a processor) and/or may be implemented with a host, an application processor or a system-on-a-chip (SoC). For signal integrity, a source termination may be implemented with a resistor RTT on a bus 1040 of the memory controller 1010. The resistor RTT may be coupled to a power supply voltage VDDQ. The memory controller 1010 may include a transmitter 1011, which may transmit a signal to at least one of the memory modules 1020 and/or 1030, and a receiver 1013 that may receive a signal from at least one of the memory modules 1020 and/or 1030. The memory controller 1010 may include a CPU 1015.

The memory modules 1020 and 1030 may be referred to as a first memory module 1020 and a second memory module 1030. The first memory module 1020 and the second memory module 1030 may be coupled to the memory controller 1010 through the bus 1040. Each of the first memory module 1020 and the second memory module 1030 may include a plurality of semiconductor memory devices and/or a registered clock driver. The first memory module 1020 may include memory ranks RK1 and RK2, and the second memory module 1030 may include memory ranks RK3 and RK4.

The memory rank RK1 may include semiconductor memory devices 1021 and 1022 and the memory rank RK2 may include semiconductor memory devices 1023 and 1024. Although not illustrated, each of the memory ranks RK3 and RK4 may include semiconductor memory devices. Each of the semiconductor memory devices 1021, 1022, 1023 and 1024 may employ the semiconductor memory device 200 of FIG. 3.

Each of the semiconductor memory devices 1021, 1022, 1023 and 1024 may be connected to the memory controller 1010 through an alert pin 1025 and the bus 1040. Each of the semiconductor memory devices 1021, 1022, 1023 and 1024 may notify the memory controller 1010 of an error state by changing a logic level of an alert signal through the alert pin 1025.

The alert pin 1025 of each of the semiconductor memory devices 1021, 1022, 1023 and 1024 may be commonly connected to the bus 1040. When at least one of the semiconductor memory devices 1021, 1022, 1023 and 1024 changes a logic level of the alert signal, a voltage across the resistor RTT is changed and thus, the CPU 1015 may identify that a situation of a hammer address queue being full occurs in at least one of the semiconductor memory devices 1021, 1022, 1023 and 1024.

Aspects of the present disclosure may be applied to systems using semiconductor memory devices that employ volatile memory cells. For example, aspects of the present disclosure may be applied to systems such as a smart phone, a navigation system, a notebook computer, a desk top computer and a game console that use the semiconductor memory device as a working memory.

As used herein, the terms "comprises", "comprising", "includes", "including", "has", "having" and any other variations thereof specify the presence of the stated features, integers, steps, operations, elements, and/or components, but do not preclude the presence or addition of one or more other features, integers, steps, operations, elements, components, and/or groups thereof.

The foregoing is illustrative of example embodiments and is not to be construed as limiting thereof. Although a few example embodiments have been described, those skilled in the art will readily appreciate that many modifications are possible in the example embodiments without materially departing from the present disclosure. Accordingly, all such modifications are intended to be included within the scope of the present disclosure as defined in the claims.

What is claimed is:

1. A semiconductor memory device comprising:
   a memory cell array that includes a plurality of memory cell rows designated by row addresses, each of the plurality of memory cell rows including a plurality of memory cells;
   a row hammer management circuit that includes a hammer address queue and is configured to:
      automatically store random count data in count cells of each of the plurality of memory cell rows during a power-up sequence of the semiconductor memory device; and
      determine counted values by counting a number of times of access associated with each of the plurality of memory cell rows in response to an active command from an external memory controller and store the counted values in the count cells of each of the plurality of memory cell rows as count data;
   wherein the hammer address queue is configured to:
      store one or more of the row addresses up to a first number based on a comparison of the counted values with a reference number of times, the one or more of the row addresses being candidate hammer addresses; and
      output one of the candidate hammer addresses stored therein as a hammer address; and
   a refresh control circuit configured to receive the hammer address and perform a hammer refresh operation on one or more of the plurality of memory cell rows that are physically adjacent to a memory cell row that corresponds to the hammer address.

2. The semiconductor memory device of claim 1, wherein the candidate hammer addresses are accessed equal to or more than the reference number of times, and
   wherein the row hammer management circuit further comprises:
   an automatic initialization controller configured to generate the random count data and the row addresses that designate each of the plurality of memory cell rows, based on a power stabilizing signal and an anti-fuse flag signal,
   wherein the power stabilizing signal indicates that an operating voltage generated based on an external voltage received during the power-up sequence of the semiconductor memory device has reached a reference voltage level, and
   wherein the anti-fuse flag signal indicates that information associated with an anti-fuse circuit of the semiconductor memory device has been transferred.

3. The semiconductor memory device of claim 2, wherein the automatic initialization controller comprises:
   a signal generator configured to generate a random initialization signal based on the anti-fuse flag signal;
   an interval signal generator configured to generate an interval signal that is activated during a first time interval, based on the random initialization signal;
   a timing generator configured to generate an active signal, an active interval signal, and a write signal based on the interval signal;
   a row address generator configured to generate the row addresses based on the active signal and configured to generate a completion signal in response to being done with generating the row addresses;
   a random seed generator configured to generate a random seed based on the power stabilizing signal; and
   a random count data generator configured to generate the random count data based on the random seed.

4. The semiconductor memory device of claim 3, wherein the timing generator is configured to:
   generate the active interval signal such that word-lines coupled to the plurality of memory cell rows are sequentially enabled during a second time interval, respectively; and
   activate the write signal within an activation interval of the active interval signal.

5. The semiconductor memory device of claim 4, wherein the row hammer management circuit is configured to write the random count data in the count cells of each of the plurality of memory cell rows in response to the write signal.

6. The semiconductor memory device of claim 3, wherein the row address generator is configured to generate the row addresses sequentially, and
   wherein the random count data generator is configured to generate the random count data randomly.

7. The semiconductor memory device of claim 3, wherein the row address generator is configured to generate the row addresses randomly, and wherein the random count data generator is configured to generate the random count data sequentially.

8. The semiconductor memory device of claim 3, wherein the random seed generator comprises:
an oscillator configured to operate in the power-up sequence in response to the power stabilizing signal and generate a clock signal with a first frequency; and
a counter configured to generate a counting signal by counting the clock signal and output the counting signal as the random seed.

9. The semiconductor memory device of claim 3, wherein the random seed generator comprises:
an oscillator configured to operate in the power-up sequence in response to the power stabilizing signal and generate a clock signal with a first frequency;
a counter configured to generate a counting signal by counting the clock signal; and
a latch circuit configured to output the random seed by latching the counting signal based on the anti-fuse flag signal.

10. The semiconductor memory device of claim 3, wherein the interval signal generator is configured to:
activate the interval signal in response to a transition of the random initialization signal; and
deactivate the interval signal in response to the completion signal being activated.

11. The semiconductor memory device of claim 1, wherein the semiconductor memory device receives a command from the memory controller after the power-up sequence and a training between the memory controller and the semiconductor memory device are completed, and
wherein the row hammer management circuit is configured to, in response to a first command applied after the active command, perform an internal read-update-write operation that comprises reading the count data from the count cells of a target memory cell row from the plurality of memory cell rows, updating the count data that was read, and writing the count data that was updated in the count cells of the target memory cell row.

12. The semiconductor memory device of claim 1, wherein the memory cell array includes a plurality of bank arrays and each of the plurality of bank arrays includes the plurality of memory cell rows, and
wherein the row hammer management circuit is configured to store the random count data in the count cells of each of the plurality of memory cell rows of each of the plurality of bank arrays in parallel during the power-up sequence.

13. The semiconductor memory device of claim 1, wherein the row hammer management circuit is configured to store the random count data in the count cells of two or more of the plurality of memory cell rows in parallel during the power-up sequence, and
wherein each of the two or more of the plurality of memory cell rows are in different sub array blocks of the memory cell array.

14. The semiconductor memory device of claim 1, wherein the row hammer management circuit further comprises:
an adder configured to update the count data read from the count cells of a target memory cell row from the plurality of memory cell rows and output the count data that was updated; and
a comparator configured to compare the count data read from the count cells of the target memory cell row with the reference number of times and output a first comparison signal, and
wherein the hammer address queue is configured to store a target access address designating the target memory cell row in response to the first comparison signal indicating that the count data read from the count cells of the target memory cell row is equal to or greater than the reference number of times.

15. The semiconductor memory device of claim 14, wherein the hammer address queue comprises:
a plurality of first-in first-out (FIFO) registers configured to store the candidate hammer addresses, wherein a number of the plurality of FIFO registers corresponds to the first number, and wherein one of the candidate hammer addresses that is stored first in the plurality of FIFO registers is a first candidate hammer address; and
a monitor logic electrically connected to the plurality of FIFO registers and configured to:
manage the plurality of FIFO registers;
monitor whether each of the plurality of FIFO registers stores a respective one of the candidate hammer addresses;
output the first candidate hammer address as the hammer address in response to a number of the candidate hammer addresses stored in the plurality of FIFO registers reaching the first number; and
transit a logic level of an alert signal that is provided to the memory controller from a first logic level to a second logic level different from the first logic level in response to outputting the hammer address.

16. The semiconductor memory device of claim 15, wherein the refresh control circuit is configured to perform the hammer refresh operation on the one or more of the plurality of memory cell rows in response to a refresh management signal based on a refresh management command from the memory controller, and
wherein the memory controller issues the refresh management command in response to a transition of the alert signal.

17. The semiconductor memory device of claim 1, further comprising:
an error correction code (ECC) engine configured to:
generate parity data by performing a first ECC encoding operation on data from normal cells in each of the plurality of memory cell rows; and
perform a second ECC encoding operation on the count data to generate count parity data, and
a control logic circuit configured to control the row hammer management circuit and the ECC engine,
wherein the memory cell array includes:
a normal cell region that includes the normal cells configured to store the data and the count cells configured to store the count data; and
a parity cell region configured to store the parity data and the count parity data,
wherein the normal cell region includes a plurality of sub array blocks arranged in a first direction and a second direction crossing the first direction, each of the plurality of sub array blocks including volatile memory cells from the plurality of memory cells, and
wherein a portion of the plurality of sub array blocks includes the count cells.

18. The semiconductor memory device of claim 1, wherein the refresh control circuit comprises:

a refresh control logic configured to generate a hammer refresh signal in response to a refresh management signal based on a refresh management command from the memory controller, wherein the refresh management command is issued by the memory controller in response to a transition of an alert signal;

a refresh clock generator configured to generate a refresh clock signal in response to a refresh signal;

a refresh counter configured to generate a counter refresh address associated with a normal refresh operation on the plurality of memory cell rows;

a hammer address storage configured to store the hammer address and configured to output the hammer address in response to the hammer refresh signal; and a mapper configured to generate hammer refresh addresses designating the one or more of the plurality of memory cell rows based on the hammer address output from the hammer address storage.

19. A memory system comprising:

a semiconductor memory device; and a memory controller configured to control the semiconductor memory device, wherein the semiconductor memory device includes:

a memory cell array that includes a plurality of memory cell rows designated by row addresses, each of the plurality of memory cell rows including a plurality of memory cells;

a row hammer management circuit that includes a hammer address queue and is configured to:

automatically store random count data in count cells of each of the plurality of memory cell rows independently from a command from the memory controller during a power-up sequence of the semiconductor memory device; and determine counted values by counting a number of times of access associated with each of the plurality of memory cell rows in response to an active command from the memory controller and store the counted values in the count cells of each of the plurality of memory cell rows as count data, wherein the hammer address queue is configured to:

store one or more of the row addresses up to a first number based on a comparison of the counted values with a reference number of times, the one or more of the row addresses being candidate hammer addresses; and output one of the candidate hammer addresses stored therein as a hammer address; and a refresh control circuit configured to receive the hammer address and perform a hammer refresh operation on one or more of the plurality of memory cell rows that are physically adjacent to a memory cell row that corresponds to the hammer address, and wherein the row hammer management circuit further includes:

an automatic initialization controller configured to generate, during the power-up sequence, the random count data and the row addresses that designate each of the plurality of memory cell rows, based on a power stabilizing signal and an anti-fuse flag signal.

20. A semiconductor memory device comprising:

a memory cell array that includes a plurality of memory cell rows designated by row addresses, each of the plurality of memory cell rows including a plurality of memory cells;

a row hammer management circuit that includes a hammer address queue and is configured to:

automatically store random count data in count cells of each of the plurality of memory cell rows during a power-up sequence of the semiconductor memory device; and determine counted values by counting a number of times of access associated with each of the plurality of memory cell rows in response to an active command from an external memory controller and store the counted values in the count cells of each of the plurality of memory cell rows as count data, wherein the hammer address queue is configured to:

store one or more of the row addresses up to a first number based on a comparison of the counted values with a reference number of times, the one or more of the row addresses being candidate hammer addresses; and output one of the candidate hammer addresses stored therein as a hammer address, a refresh control circuit configured to receive the hammer address and perform a hammer refresh operation on one or more of the plurality memory cell rows that are physically adjacent to a memory cell row that corresponds to the hammer address; and a control logic circuit configured to control the row hammer management circuit and the refresh control circuit, and wherein the control logic circuit is configured to perform a self-refresh operation on the plurality of memory cell rows after the random count data is stored in the count cells of each of the plurality of memory cell rows.

* * * * *